United States Patent
Iwaki et al.

(10) Patent No.: US 10,607,998 B1
(45) Date of Patent: Mar. 31, 2020

(54) INTEGRATED CIRCUITRY, DRAM CIRCUITRY, METHOD OF FORMING A PLURALITY OF CONDUCTIVE VIAS, AND METHOD OF FORMING DRAM CIRCUITRY

(71) Applicant: Micron Technology, Inc., Boise, ID (US)

(72) Inventors: Takayuki Iwaki, Hiroshima (JP); Akira Kaneko, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 51 days.

(21) Appl. No.: 16/148,148

(22) Filed: Oct. 1, 2018

(51) Int. Cl.
*H01L 27/108* (2006.01)
*H01L 21/768* (2006.01)
*H01L 21/02* (2006.01)
*H01L 21/311* (2006.01)

(52) U.S. Cl.
CPC .... *H01L 27/10855* (2013.01); *H01L 21/0214* (2013.01); *H01L 21/0217* (2013.01); *H01L 21/76802* (2013.01); *H01L 21/76831* (2013.01); *H01L 21/76877* (2013.01); *H01L 27/10814* (2013.01); *H01L 27/10823* (2013.01); *H01L 27/10876* (2013.01); *H01L 27/10882* (2013.01); *H01L 21/02271* (2013.01); *H01L 21/02326* (2013.01); *H01L 21/31111* (2013.01)

(58) Field of Classification Search
CPC ............ H01L 21/0214; H01L 21/0217; H01L 21/76802; H01L 21/76831; H01L 21/76877; H01L 27/10814; H01L 27/10823; H01L 27/10855; H01L 27/10876; H01L 27/10882
See application file for complete search history.

(56) References Cited

U.S. PATENT DOCUMENTS

| | | | |
|---|---|---|---|
| 10,157,841 B2 * | 12/2018 | Borsari | ............. H01L 27/10855 |
| 2017/0148799 A1 * | 5/2017 | Basker | ............. H01L 21/76897 |
| 2018/0301412 A1 | 10/2018 | Borsari | |

OTHER PUBLICATIONS

U.S. Appl. No. 16/232,634, filed Dec. 26, 2018, by Sasaki.
U.S. Appl. No. 16/399,348, filed Apr. 30, 2019, by Kim et al.
Kane et al.,"Use of SiBN and SiBON Films Prepared by Plasma Enhanced Chemical Vapor Deposition from Borazine as Interconnection Dielectrics", The Electrochemical Society vol. 144, No. 2, Feb. 1997, United States, pp. 658-663.
Kim et al., "A Highly Manufacturable Low-k ALD-SiBN Process for 60mm NAND Flash Devices and Beyond", IEEE, 2004, United States, pp. 42.5.1-42.5.4.

* cited by examiner

*Primary Examiner* — Andrew Q Tran
(74) *Attorney, Agent, or Firm* — Wells St. John P.S.

(57) ABSTRACT

A method of forming a plurality of conductive vias comprises forming spaced contact openings individually having two opposing sidewalls comprising $Si_wB_xO_yN_z$, where "w" is from 0.1 to 0.3, "x" is from 0.1 to 0.4, "y" is from 0 to 0.2, and "z" is from 0.4 to 0.6. A lining comprising silicon nitride is formed over the two opposing sidewalls in individual of the contact openings. A conductive via is formed in the individual contact openings over the lining. Integrated circuitry is disclosed.

27 Claims, 29 Drawing Sheets

INTEGRATED CIRCUITRY, DRAM CIRCUITRY, METHOD OF FORMING A PLURALITY OF CONDUCTIVE VIAS, AND METHOD OF FORMING DRAM CIRCUITRY

TECHNICAL FIELD

Embodiments disclosed herein pertain to integrated circuitry, to DRAM circuitry, to methods of forming a plurality of conductive vias, and to methods of forming DRAM circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry. Regardless, a conductive via is an elevationally-extending (e.g., vertical) conductor that is used to electrically connect upper and lower capacitors, transistors, and other integrated circuitry components together. Such may be patterned in an array. As immediately-laterally-adjacent conductive vias get closer and closer together, undesired parasitic capacitance increases and can adversely impact circuit operation.

DETAILED DESCRIPTION OF EXAMPLE EMBODIMENTS

Figure 1:
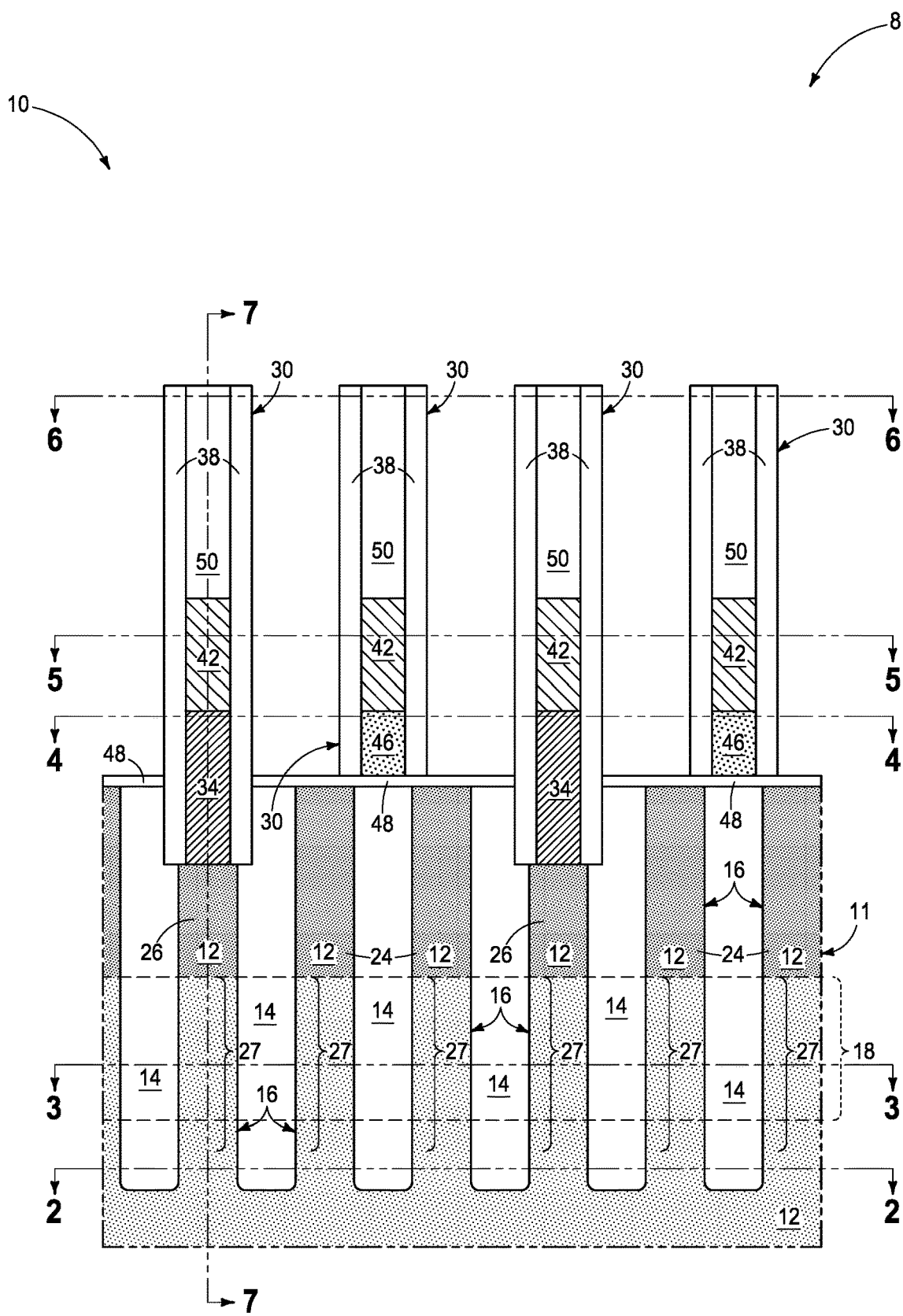
FIG. 1 is a diagrammatic cross-sectional view of a portion of a DRAM construction in process in accordance with some embodiments of the invention and is taken through line 1-1 in FIGS. 2-6 and 9.
Figure 2:
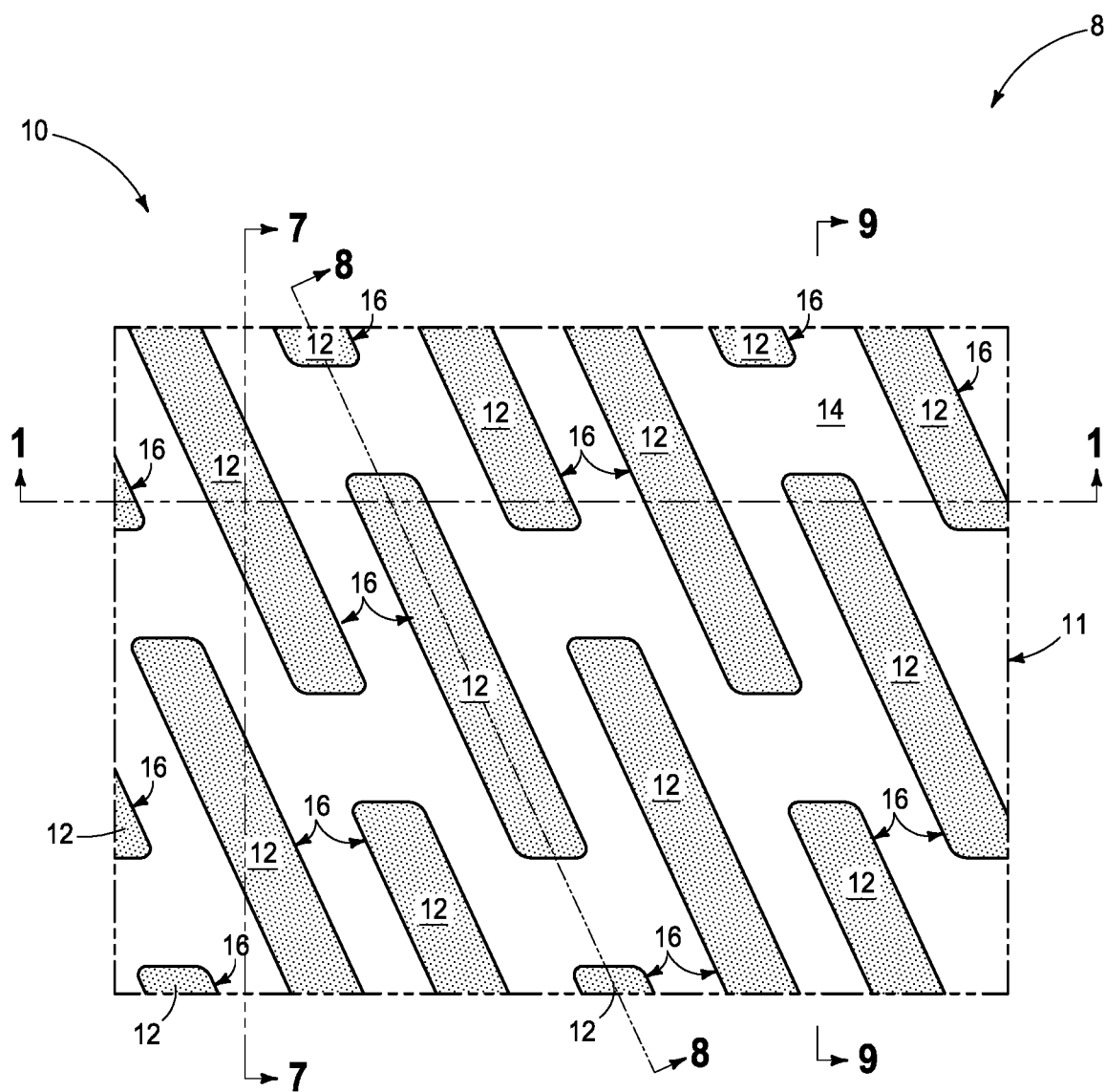
FIG. 2 is a view taken through line 2-2 in FIGS. 1 and 7-9.
Figure 3:
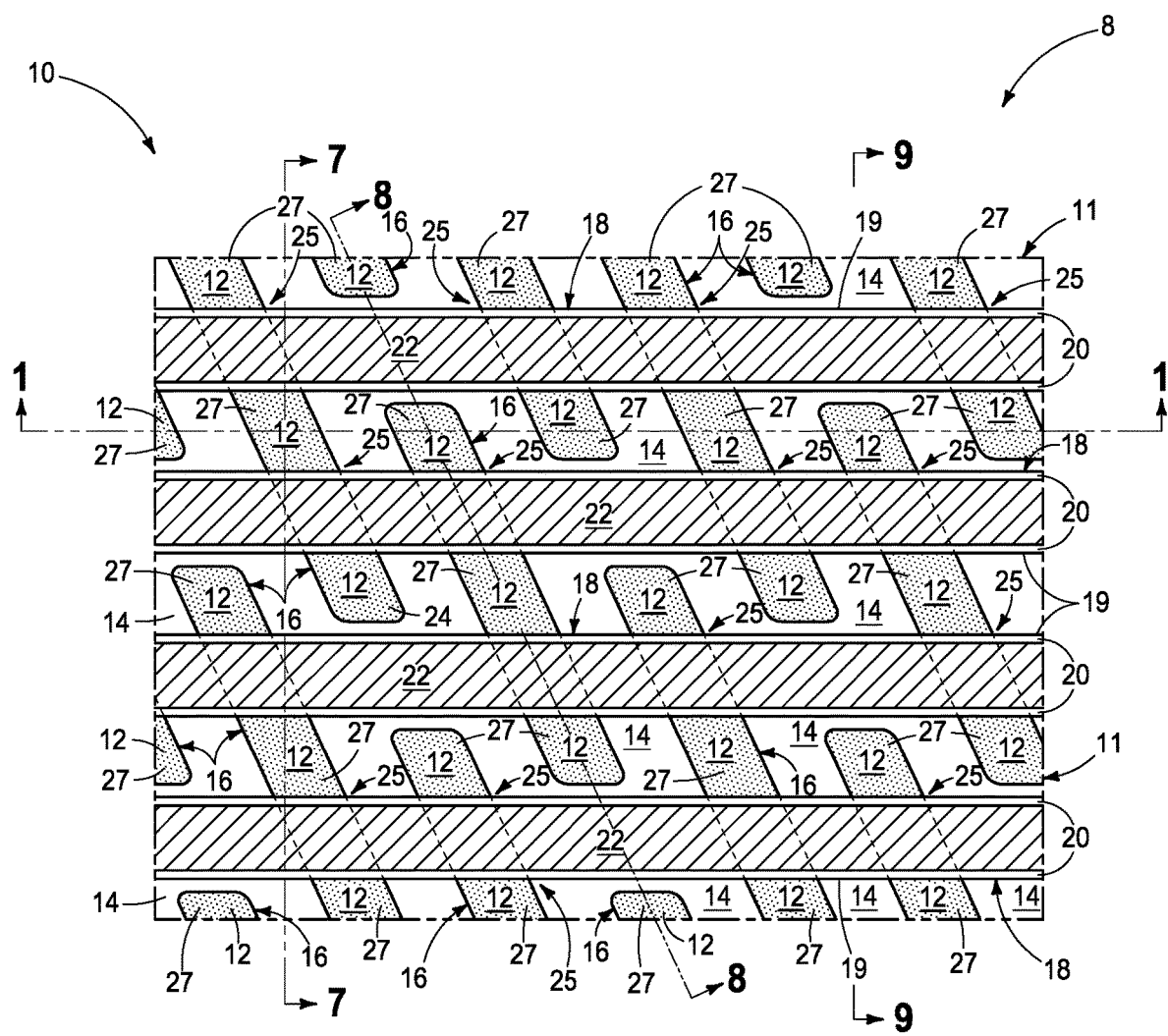
FIG. 3 is a view taken through line 3-3 in FIGS. 1 and 7-9.
Figure 4:
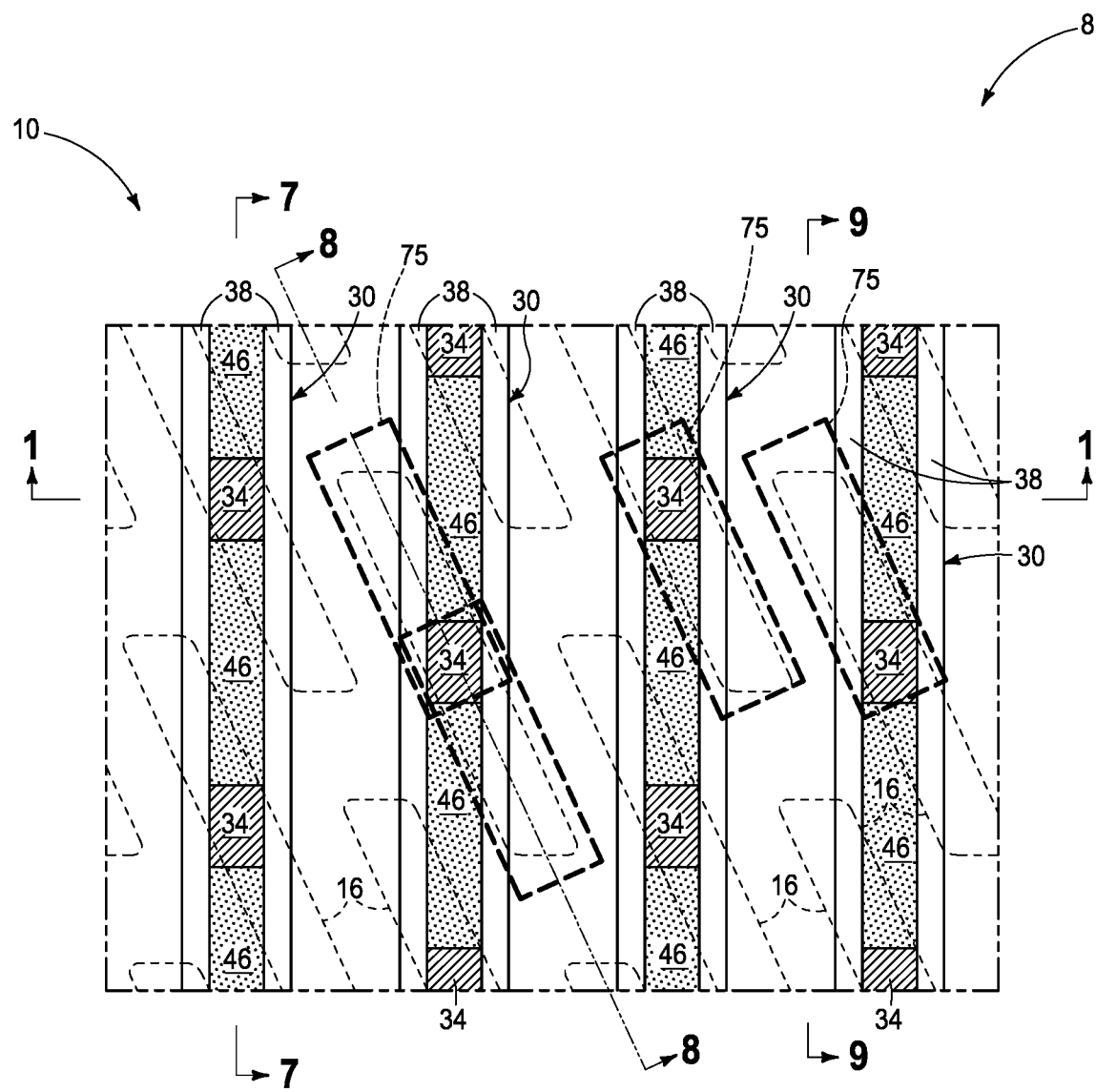
FIG. 4 is a view taken through line 4-4 in FIGS. 1 and 7-9.
Figure 5:
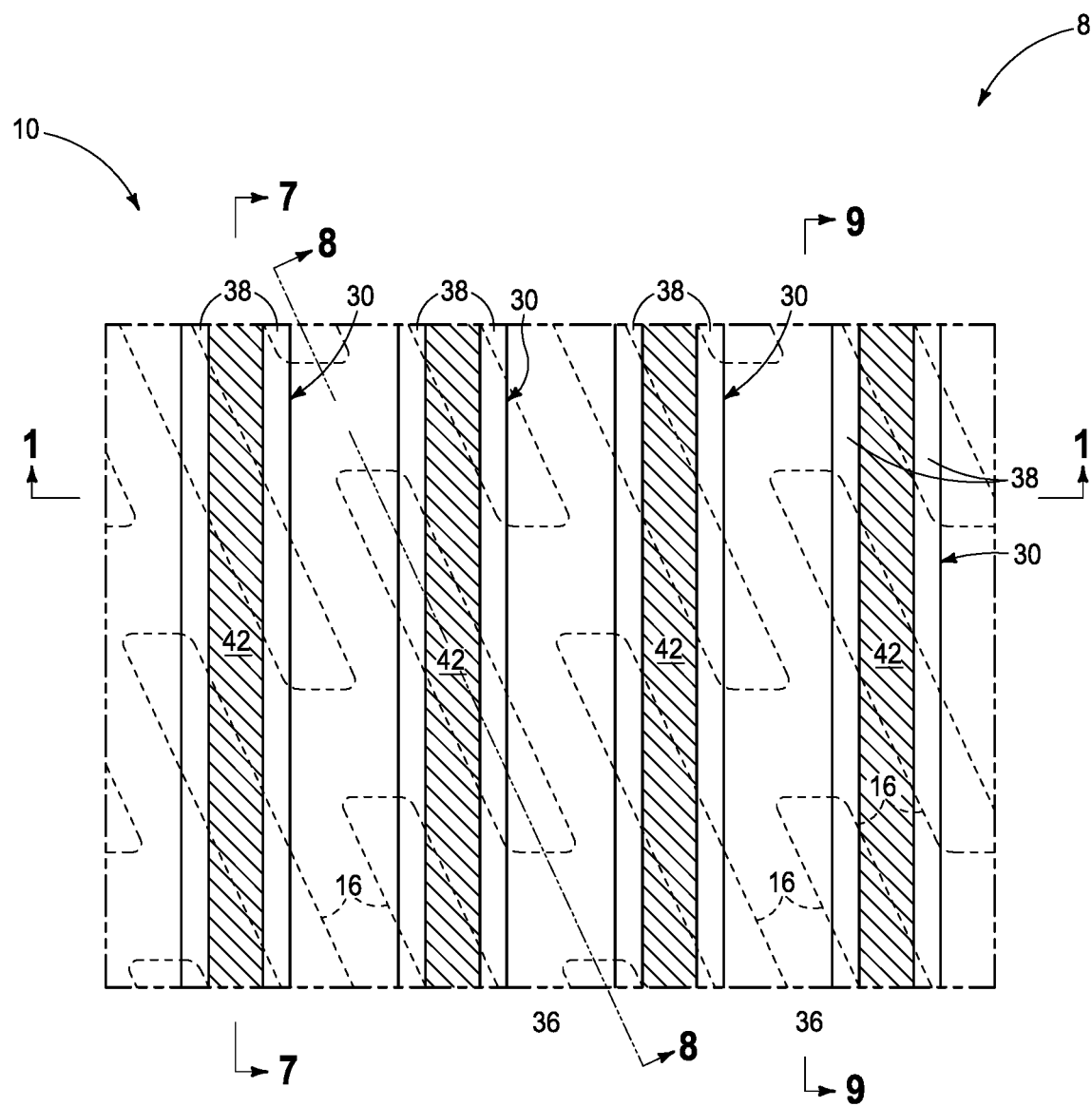
FIG. 5 is a view taken through line 5-5 in FIGS. 1 and 7-9.
Figure 6:
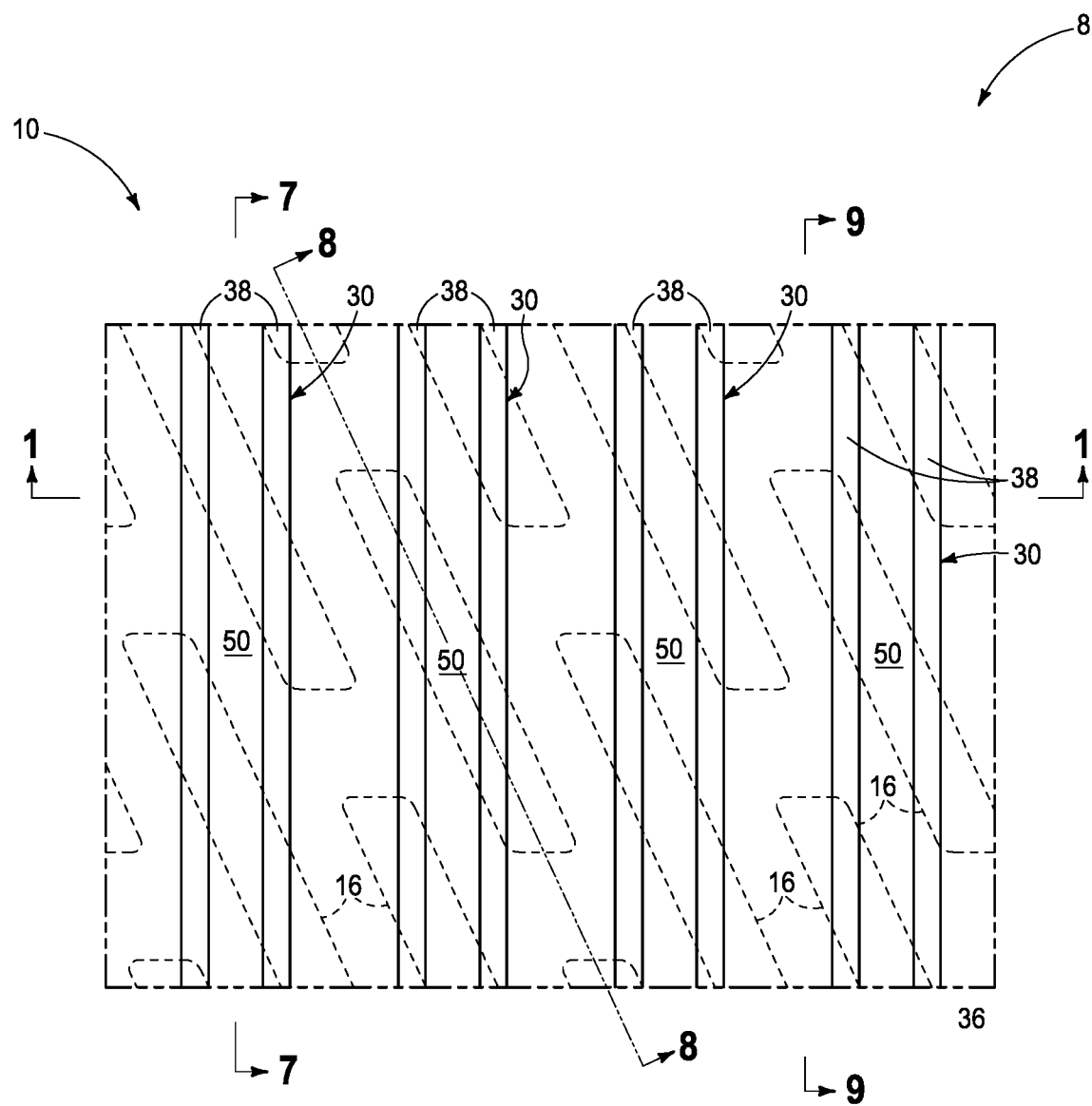
FIG. 6 is a view taken through line 6-6 in FIGS. 1 and 7-9.
Figure 7:
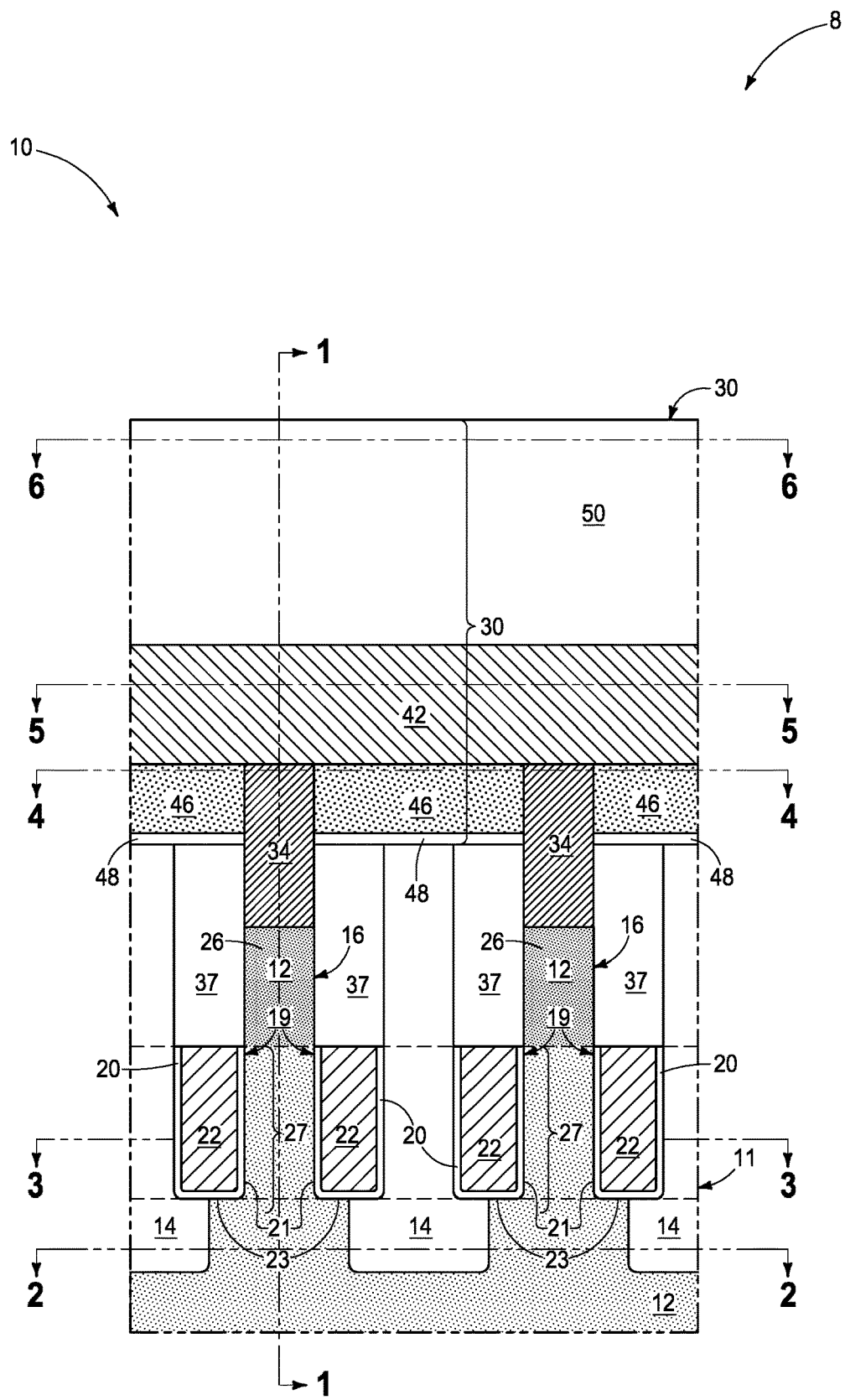
FIG. 7 is a view taken through line 7-7 in FIGS. 1-6.
Figure 8:
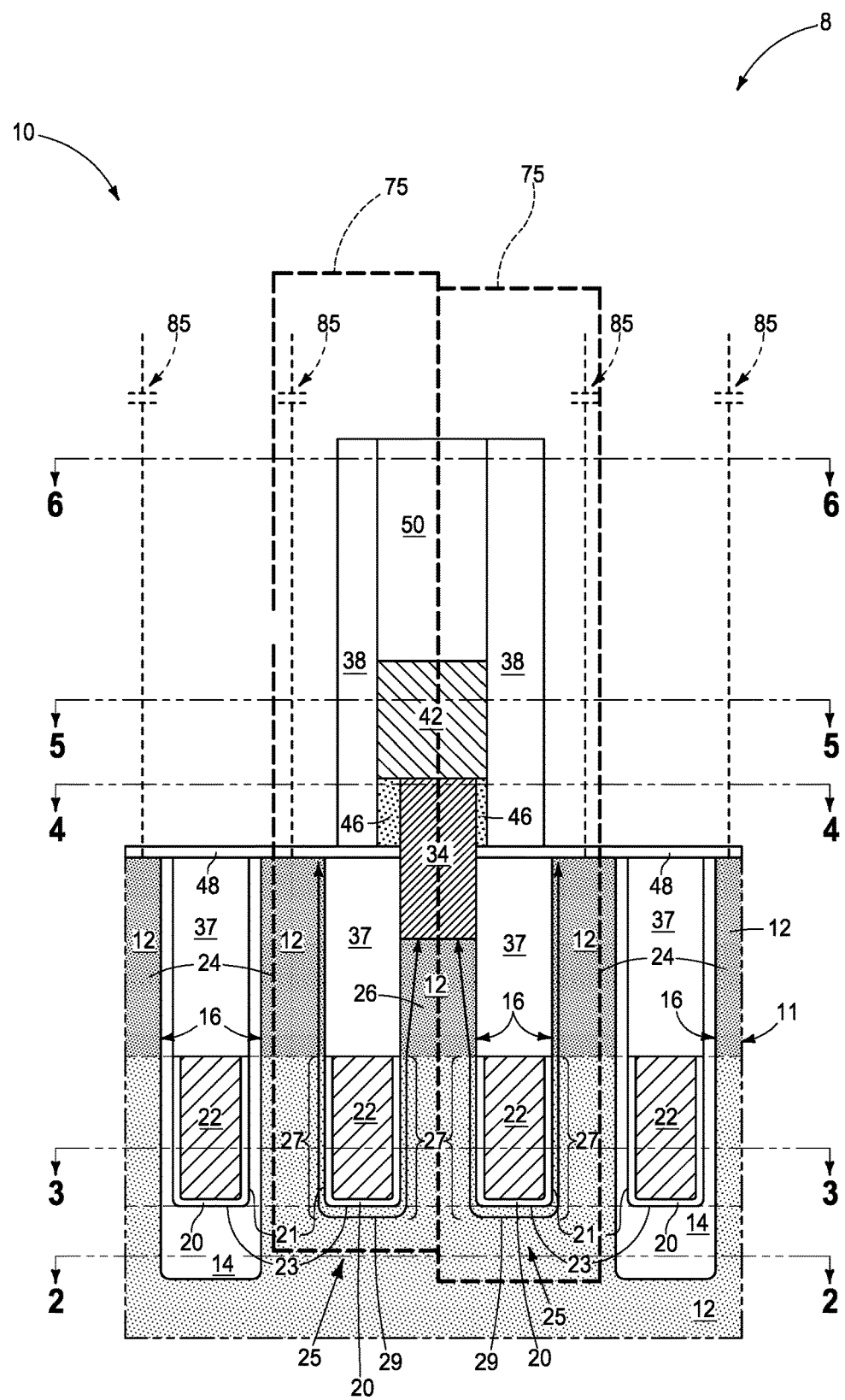
FIG. 8 is a view taken through line 8-8 in FIGS. 2-6.
Figure 9:
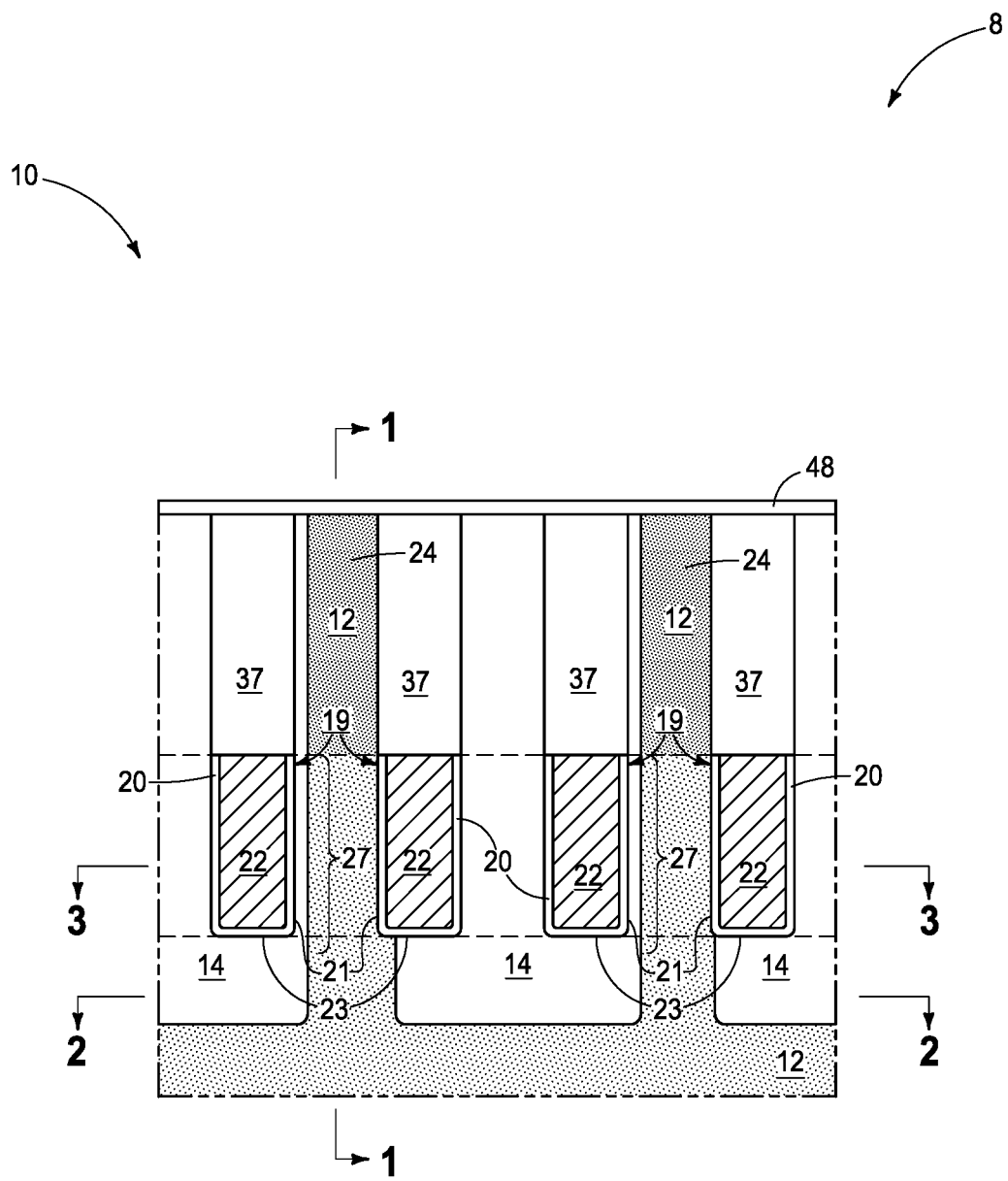
FIG. 9 is a view taken through line 9-9 in FIGS. 2-6.
Figure 10:
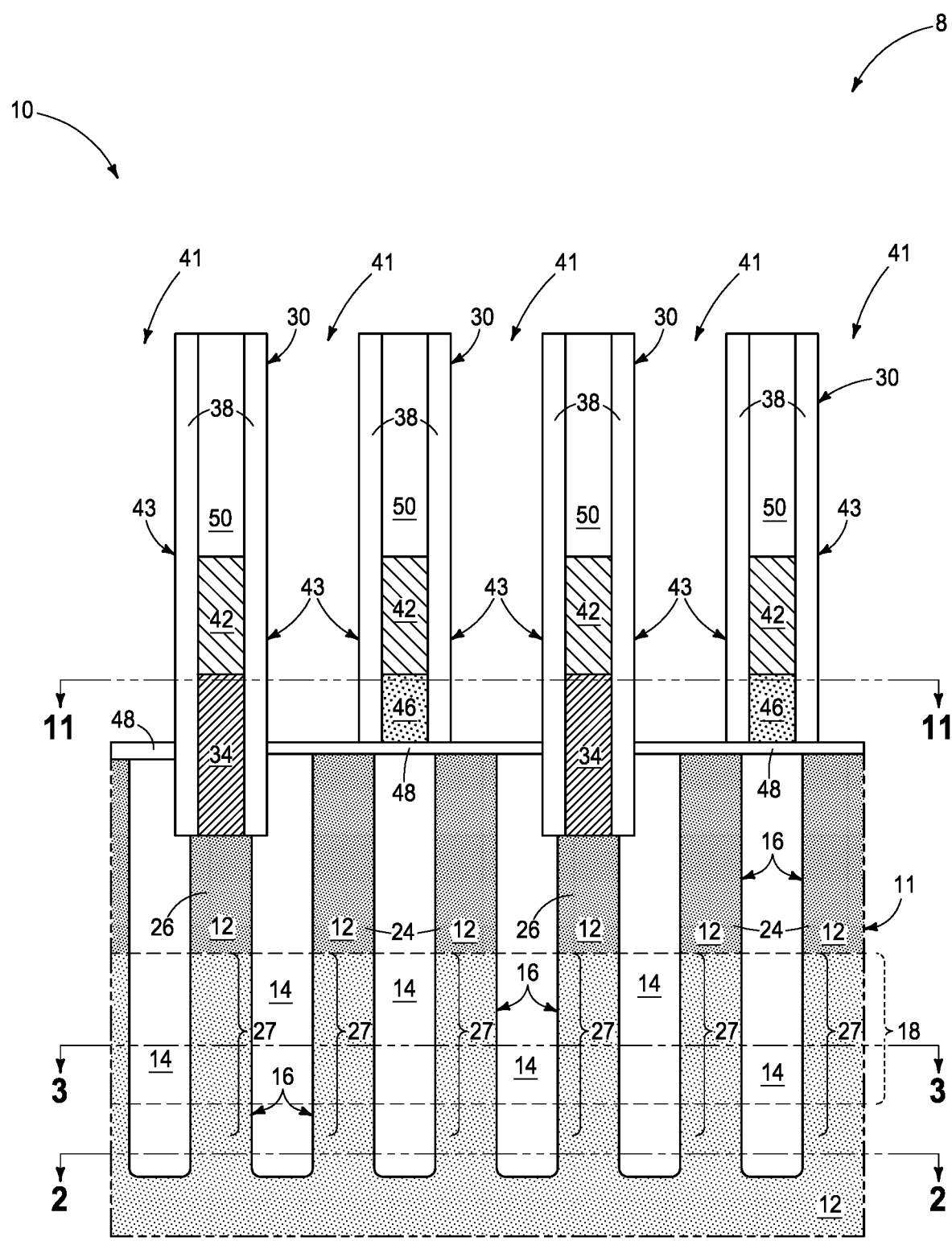
FIG. 10 is a view of the FIG. 1 construction at a processing step subsequent to that shown by FIG. 1 and is taken through line 10-10 in FIG. 11.
Figure 11:
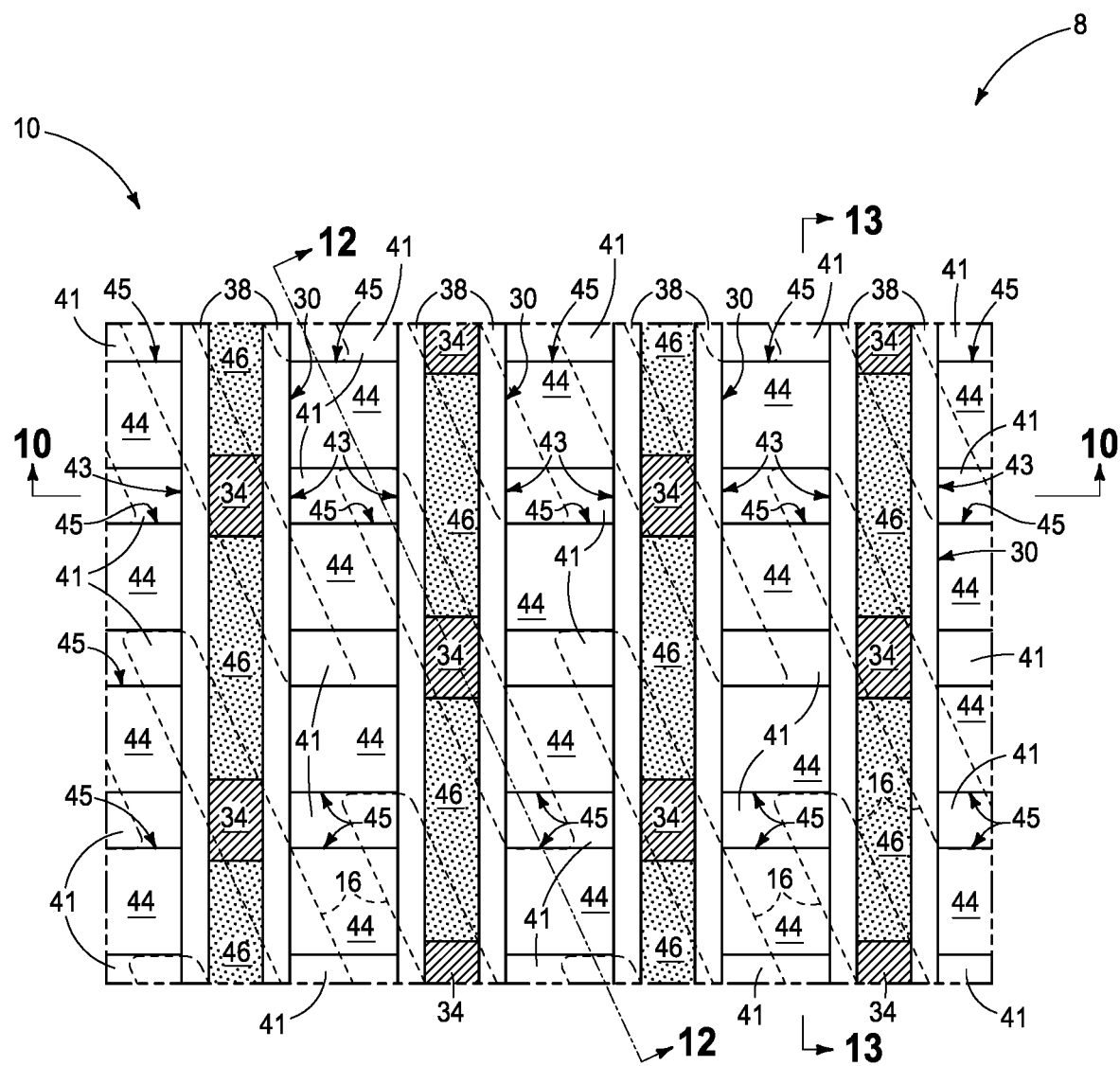
FIG. 11 is a view taken through line 11-11 in FIG. 10.
Figure 12:
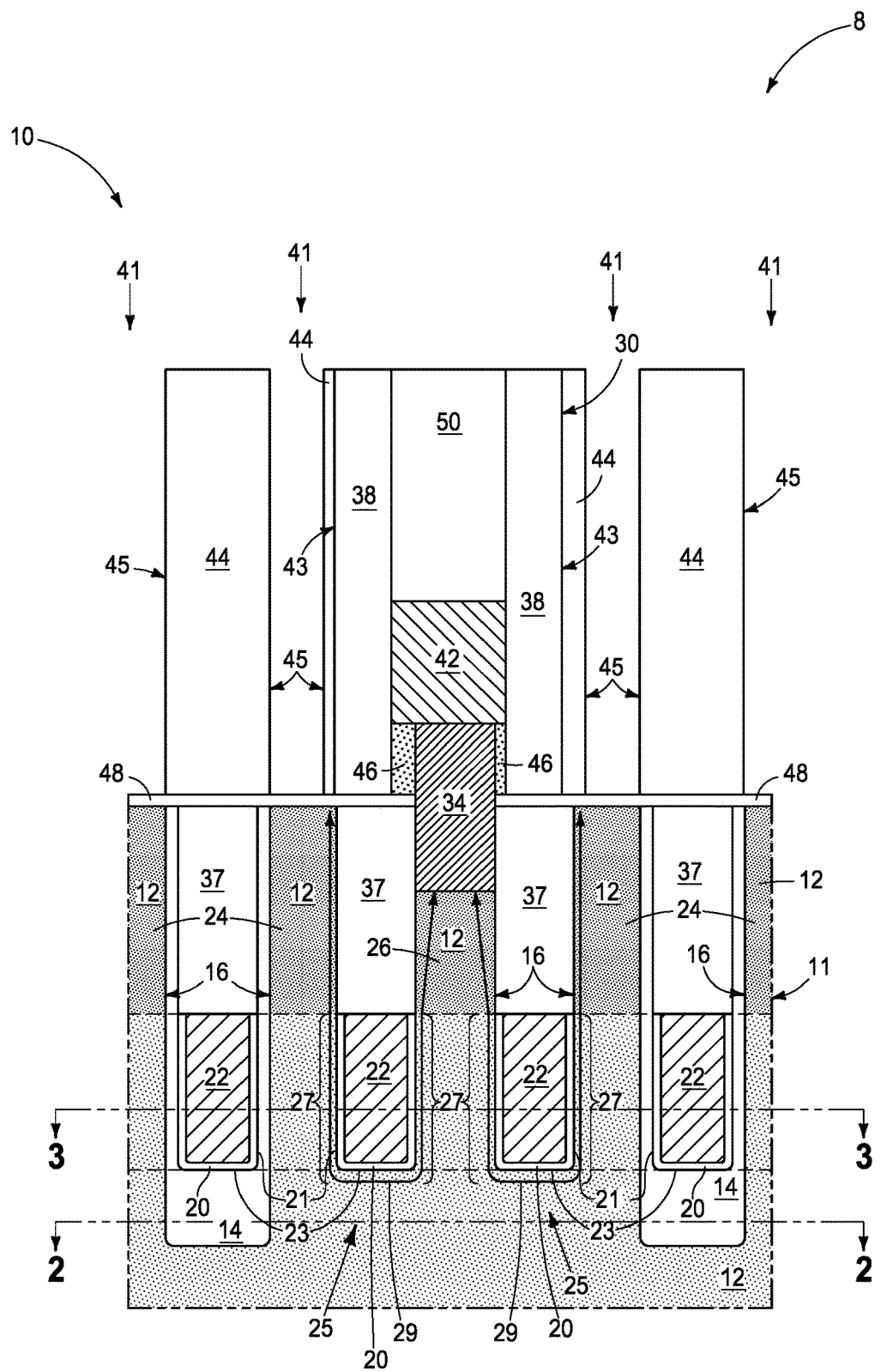
FIG. 12 is a view taken through line 12-12 in FIG. 11.
Figure 13:
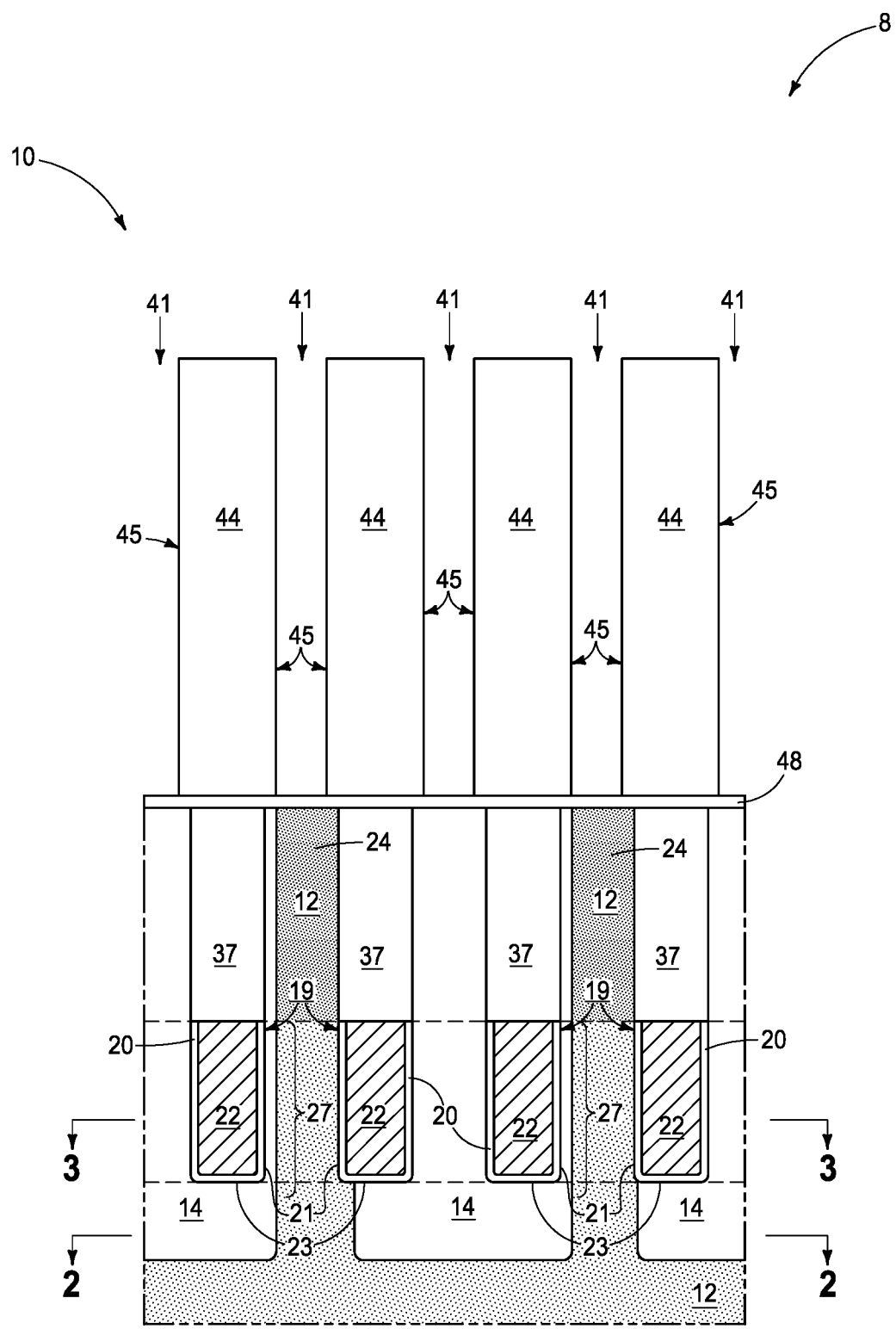
FIG. 13 is a view taken through line 13-13 in FIG. 11.

Embodiments of the invention encompass integrated circuitry, DRAM circuitry, a method of forming a plurality of conductive vias, and a method of forming DRAM circuitry. Example embodiments of a method of forming DRAM circuitry are described initially with reference to FIGS. 1-28.

Referring to FIGS. 1-9, such show an example fragment of a substrate construction 8 comprising an array or array area 10 that has been fabricated relative to a base substrate 11. Substrate construction 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-9-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 will comprise memory cells occupying space within outlines 75 (only two outlines 75 shown in FIG. 8 and only four outlines 75 shown in FIG. 4, for clarity in such figures), for example DRAM memory cells, individually comprising a field effect transistor device 25 (FIGS. 3 and 8) and a charge-storage device (described below). However, embodiments of the invention encompass fabricating of other memory cells and other constructions of integrated circuitry independent of whether containing memory cells.

Example transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

A channel region 27 (FIGS. 1, 7, and 8) is in semiconductive material 12 below pair of source/drain regions 24, 26 along trench sidewalls 21 (FIGS. 7 and 8) and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 8]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

In one embodiment, digitline structures 30 have been formed and that individually directly electrically couple to the one shared source/drain region 26 of multiple of the individual pairs of devices 25. Digitline structures 30 comprise conductive material 42 (e.g., metal material and/or conductively-doped semiconductive material). Elevationally-extending conductive vias 34 (e.g., metal material and/or conductively-doped semiconductive material) are spaced longitudinally along digitline structures 30 and extend downwardly from conductive material 42. Conductive vias 34 individually directly electrically couple digitline structures 30 to individual of shared source/drain regions 26 of the individual pairs of devices 25. Doped or undoped semiconductor material 46 is between immediately-longitudinally-adjacent conductive vias 34. Lower insulative material 48 (e.g., one or more of silicon dioxide, silicon nitride, aluminum dioxide, hafnium oxide, etc.; e.g., thickness of 50 to 200 Angstroms) is below semiconductor material 46 between immediately-longitudinally-adjacent conductive vias 34. As alternate examples, material 46 may comprise insulative material or metal material or be eliminated, with conductive material 42 extending inwardly to lower insulative material 48 (not shown). Example digitline structures 30 comprise an insulator-material cap 50 (e.g., silicon nitride) and insulator-material sidewalls 38 (e.g., silicon nitride).

A pair of capacitors (e.g., dashed lines designated as 85 in FIG. 8, but not yet fabricated) will individually directly electrically couple to one of the other source/drain regions 24 in the individual pairs of devices 25.

Referring to FIGS. 10-13, spaced sidewalls 45 have been formed along and between digitline constructions 30 thereby forming spaced contact openings 41 between and along immediately-adjacent digitline constructions 30. Accordingly, and in one embodiment, spaced contact openings 41 may be considered as individually having a first two opposing sidewalls 45 and a second two opposing sidewalls 43. Sidewalls 45 are formed of material 44 comprising $Si_wB_xO_yN$I, where "w" is from 0.1 to 0.3, "x" is from 0.1 to 0.4, "y" is from 0 to 0.2, and "z" is from 0.4 to 0.6. Second two opposing sidewalls 43 comprise an insulator material (e.g., 38) that is of different composition from $Si_wB_xO_yN_z$. In one embodiment, "y" is greater than 0, and in one such embodiment is more than 0.05. In one embodiment, the $Si_wB_xO_yN_z$ is devoid of O, and in one such embodiment "y" is 0. In this document, "devoid of" means no more than 0.05 atomic percent of the stated element or material. Example techniques of forming material 44 include chemical vapor deposition (CVD) of $Si_wB_xO_yN_z$ and CVD of silicon nitride followed by boron and/or oxygen ion implantation thereof.

Figure 14:
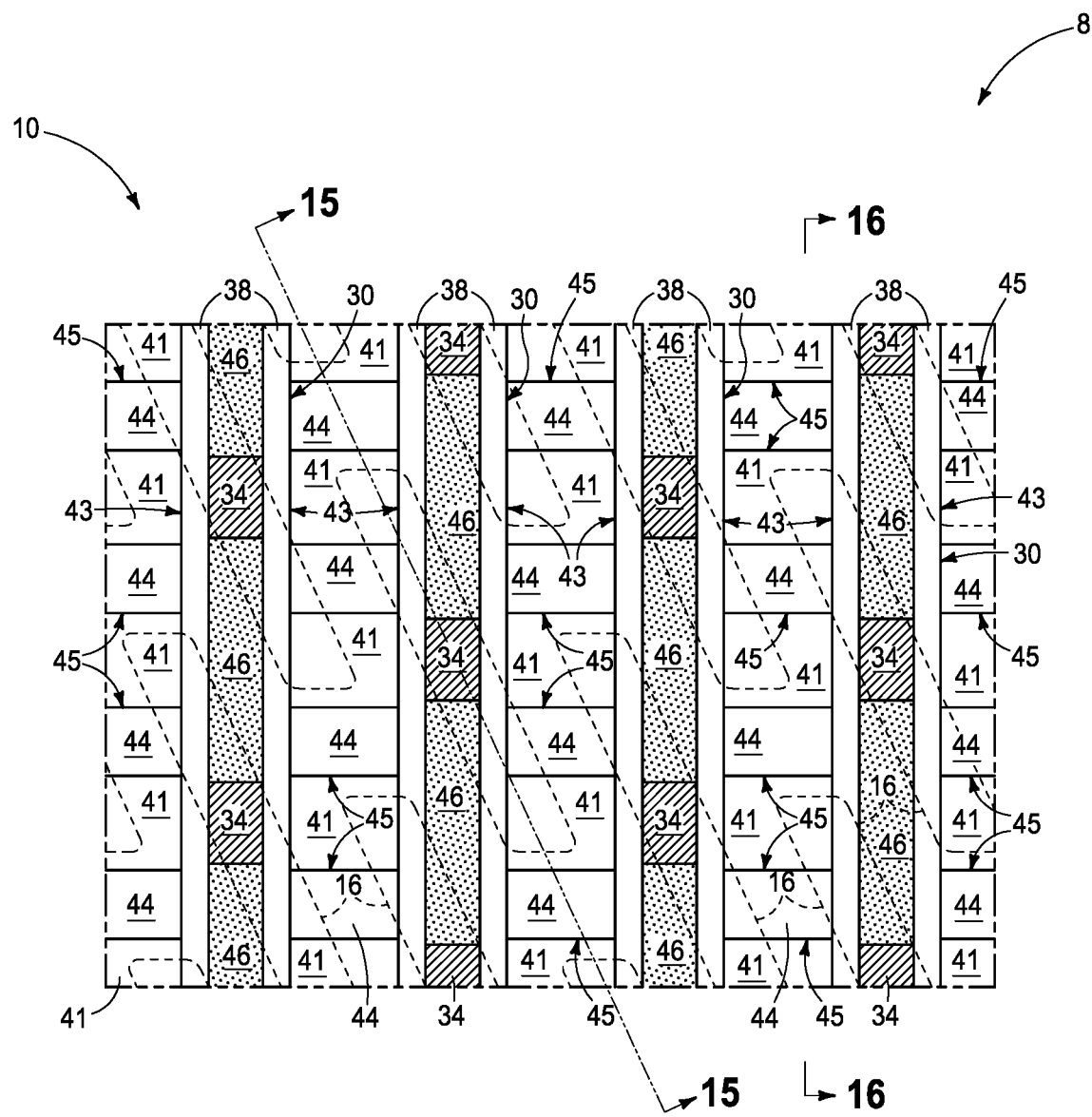
FIG. 14 is a view of the FIG. 11 construction at a processing step subsequent to that shown by FIG. 11.
Figure 15:
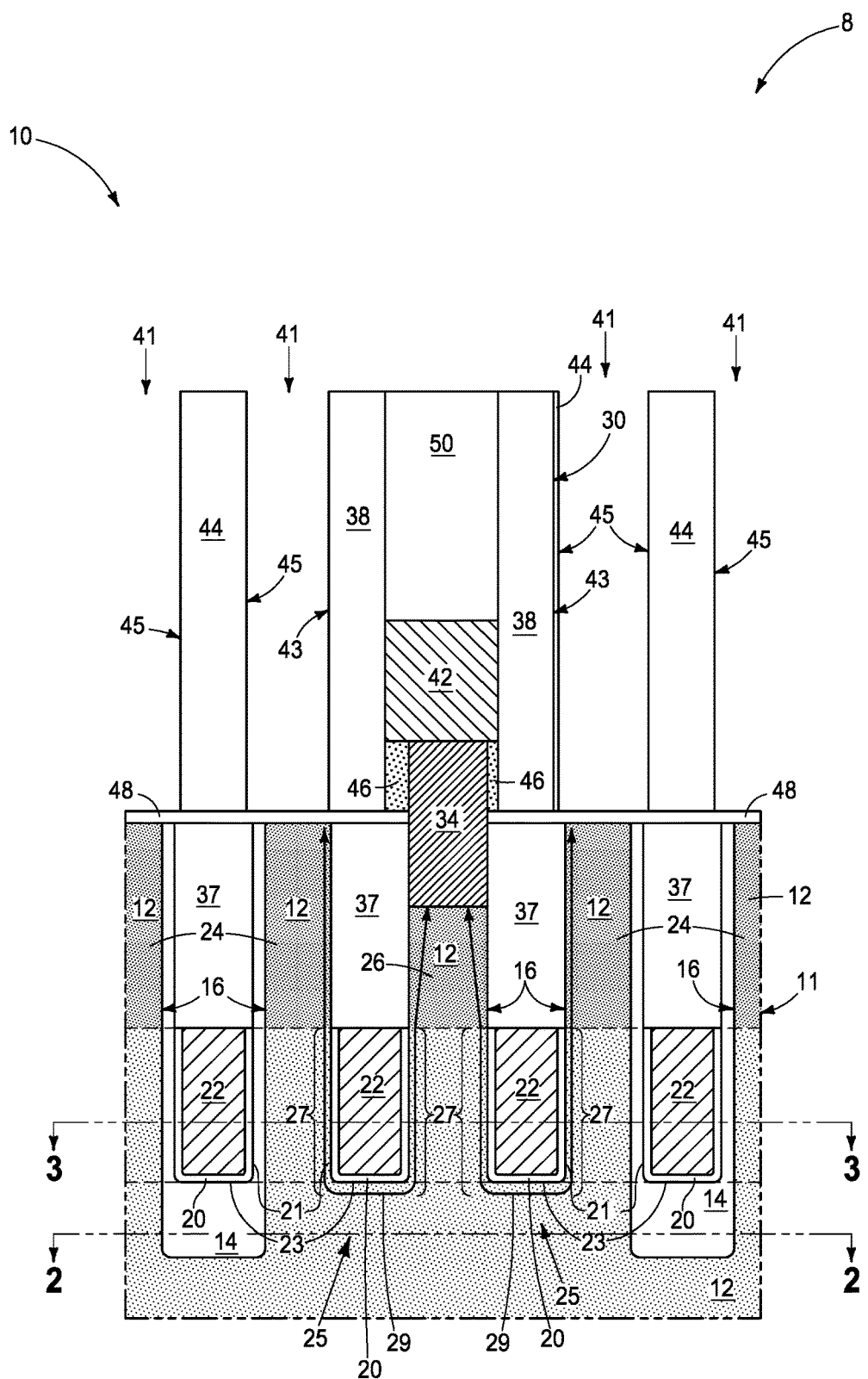
FIG. 15 is a view taken through line 15-15 in FIG. 14.
Figure 16:
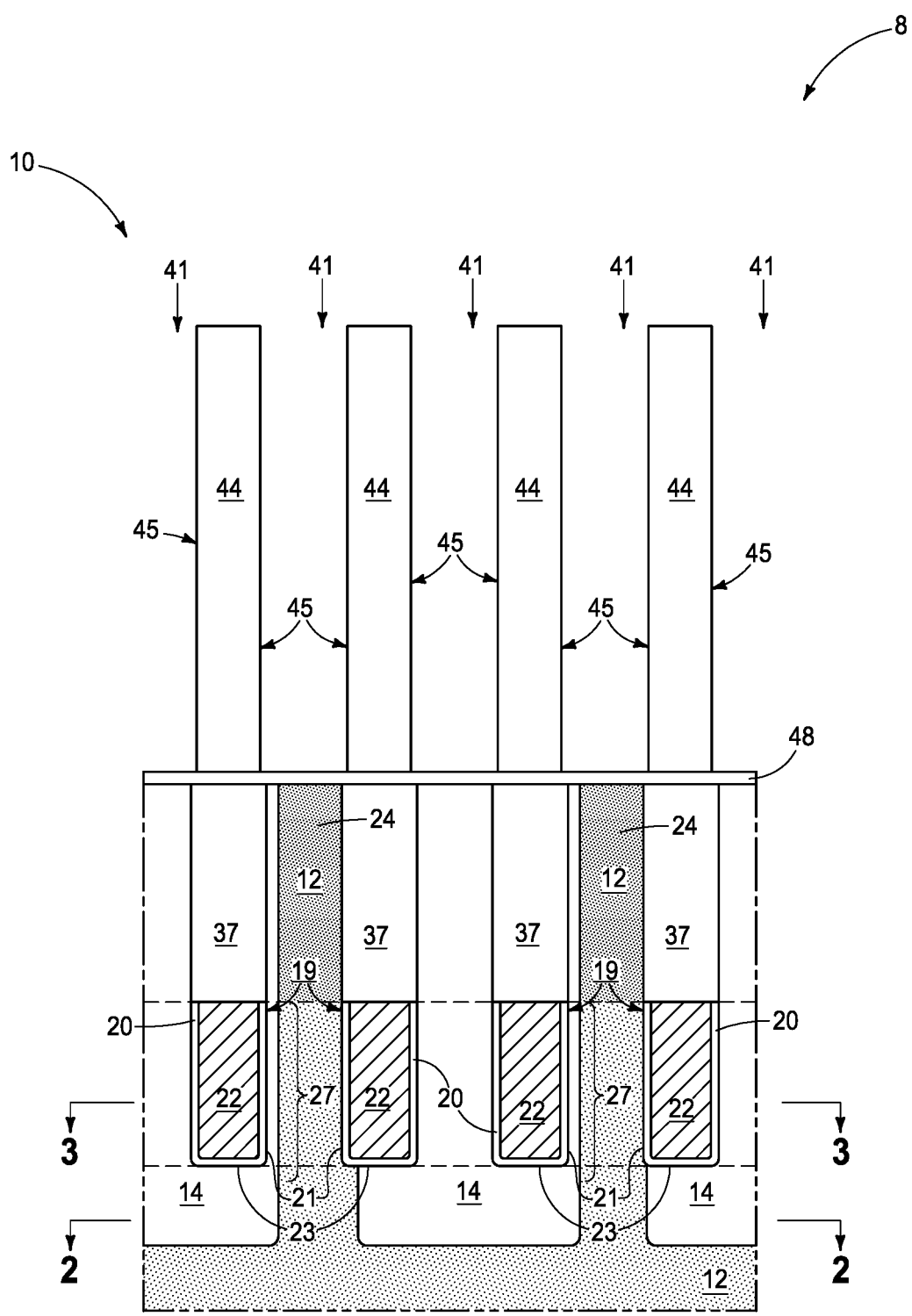
FIG. 16 is a view taken through line 16-16 in FIG. 14.
Figure 17:
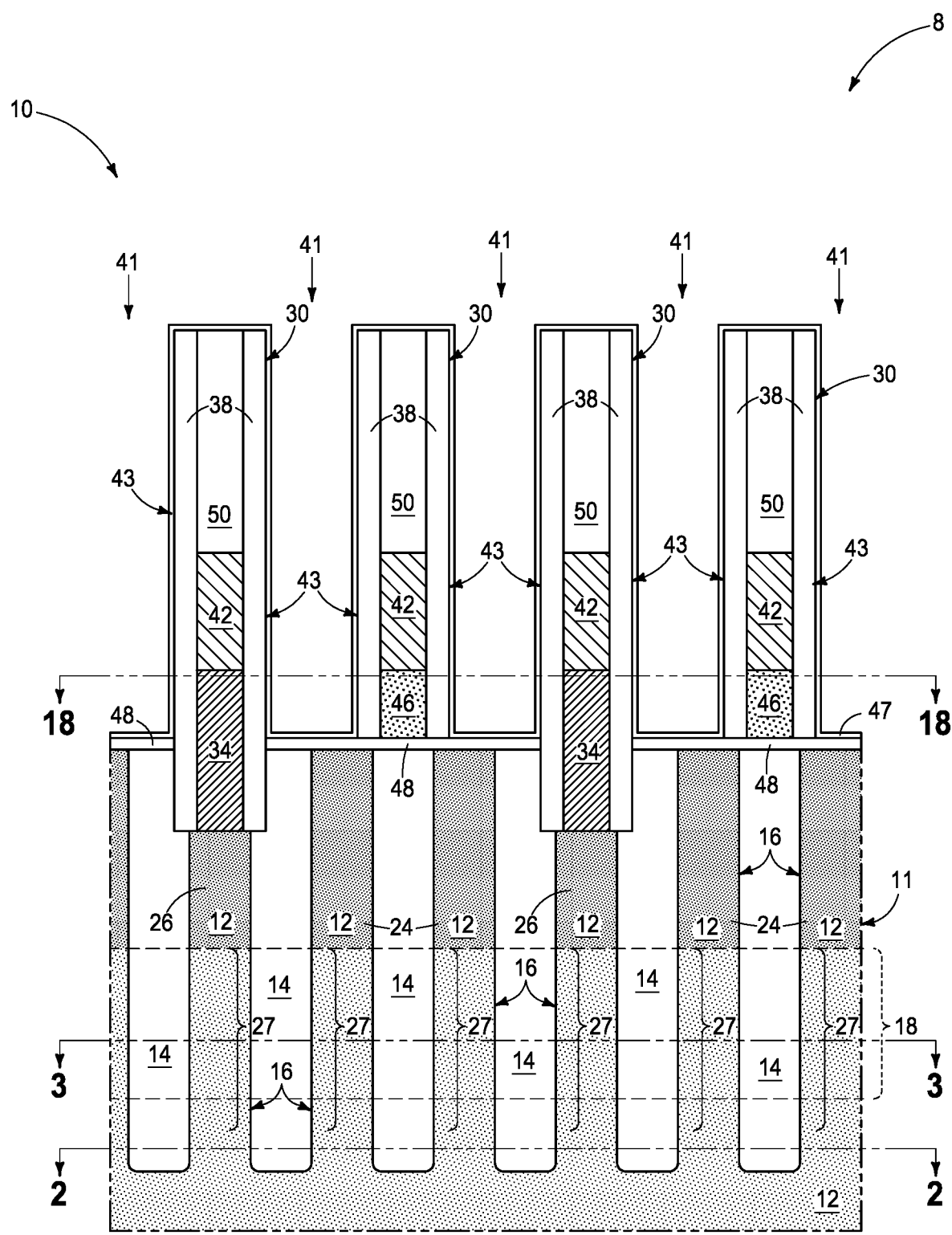
FIG. 17 is a view of the FIG. 14 construction at a processing step subsequent to that shown by FIG. 14 and is taken through line 17-17 in FIG. 18.
Figure 18:
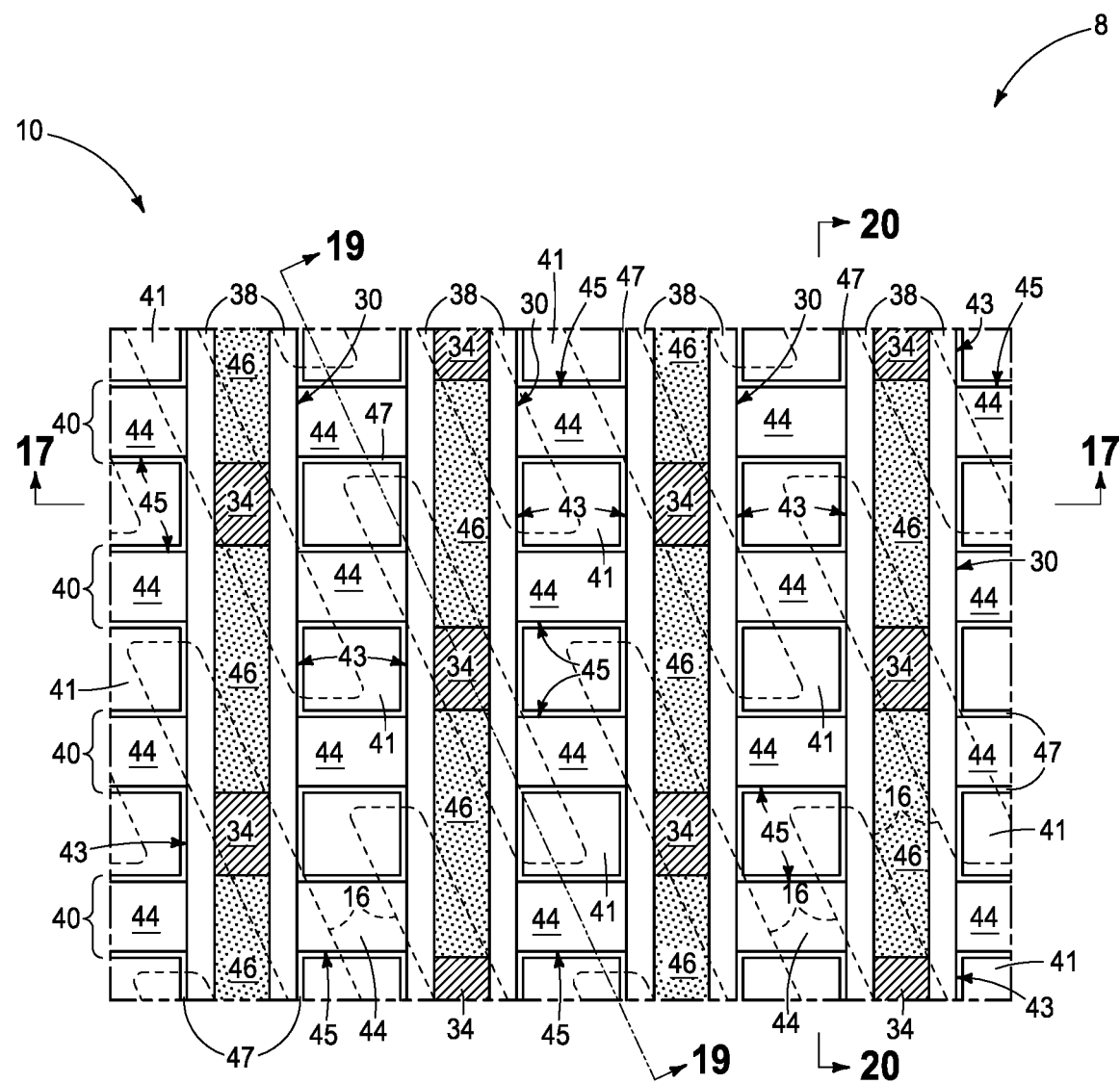
FIG. 18 is a view taken through line 18-18 in FIG. 17.
Figure 19:
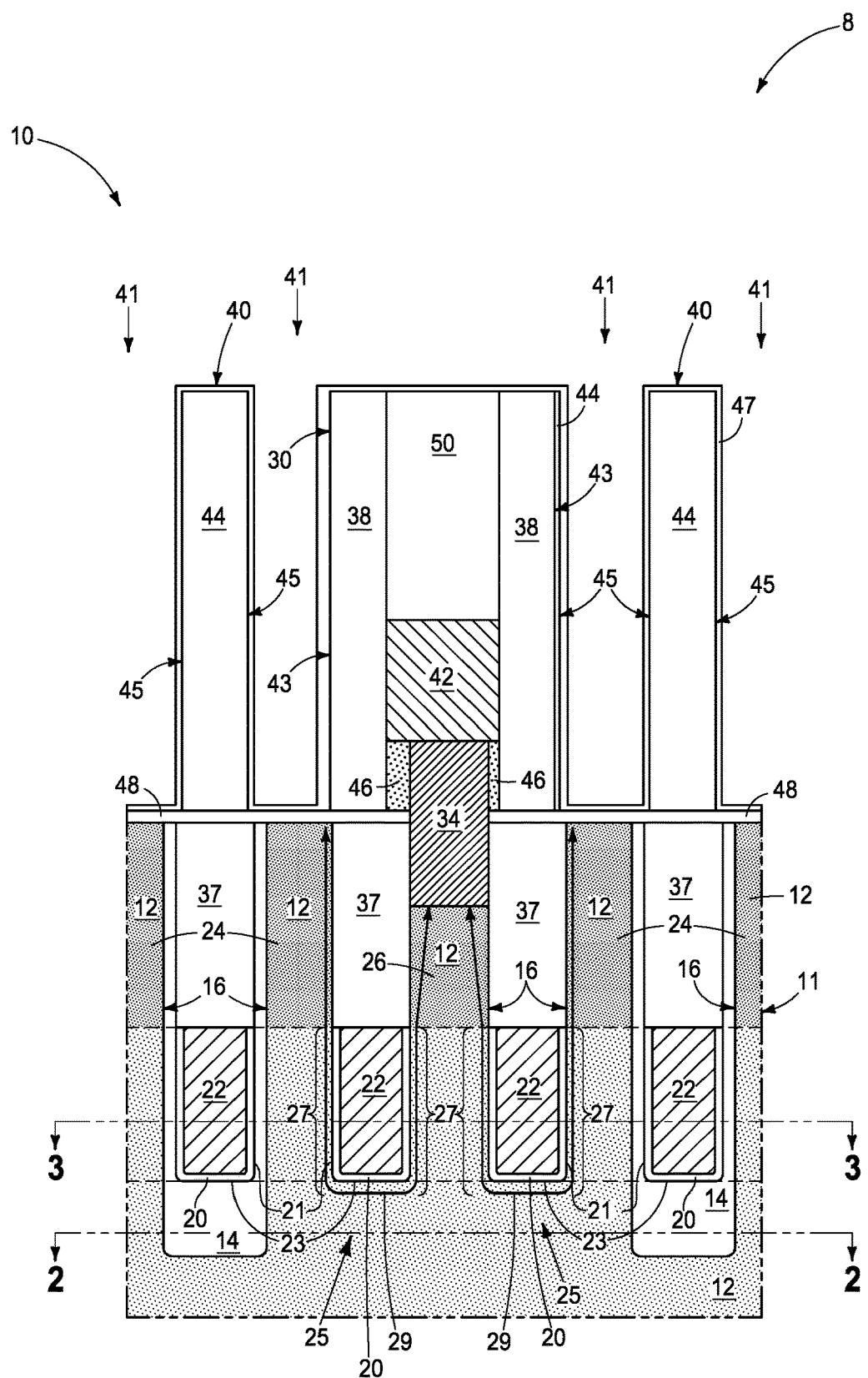
FIG. 19 is a view taken through line 19-19 in FIG. 18.
Figure 20:
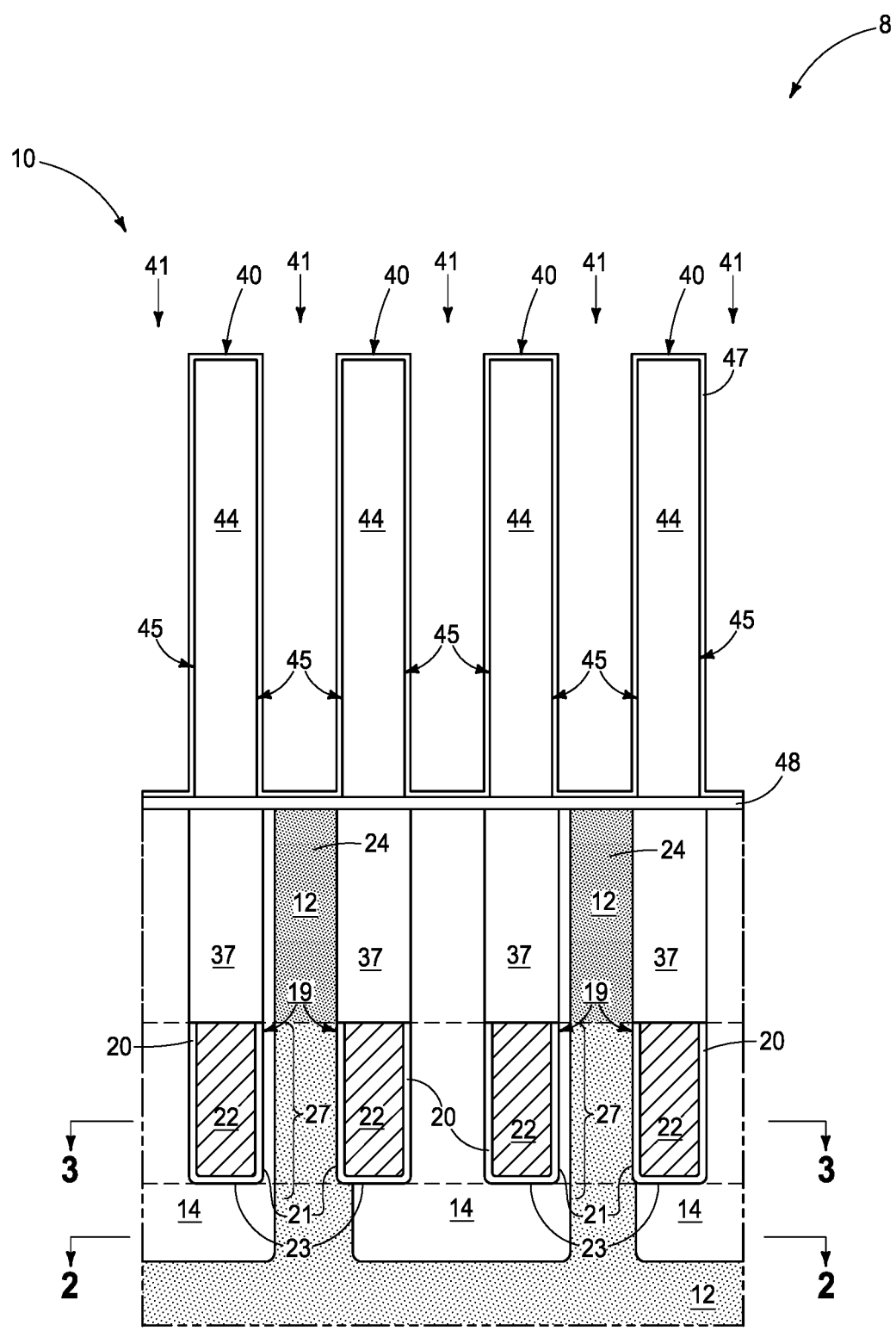
FIG. 20 is a view taken through line 20-20 in FIG. 18.

Referring to FIGS. 14-16, and in one embodiment, material 44 comprising $Si_wB_xO_yN_z$ has been etched (e.g., by wet isotropic etching using a mixture of sulphuric acid, hydrogen peroxide, and water and/or a mixture ammonium hydroxide, hydrogen peroxide, and water) to narrow sidewalls 45 and enlarge contact openings 41. Elevational thickness of $Si_wB_xO_yN_z$-comprising material 44 may be reduced thereby (not shown).

Referring to FIG. 17-20, a lining 47 comprising silicon nitride has been formed over first two opposing sidewalls 45 and over second two opposing sidewalls 43 in individual contact openings 41. In some embodiments, such may be considered as forming insulative walls 40 that comprise a core (e.g., material 44) and a lining (e.g., 47) on opposite sides of the core, with the core comprising $Si_wB_xO_yN_z$ and the lining comprising silicon nitride. In one embodiment, lining 47 is devoid of B, and in one embodiment is devoid of O. In one embodiment, lining 47 consists essentially of silicon nitride, and in one embodiment consists of silicon nitride. In one embodiment, lining 47 comprises O at no greater than 25 atomic percent, in one such embodiment at no greater than 10 atomic percent, and in one such embodiment at no greater than 1 atomic percent.

Figure 21:
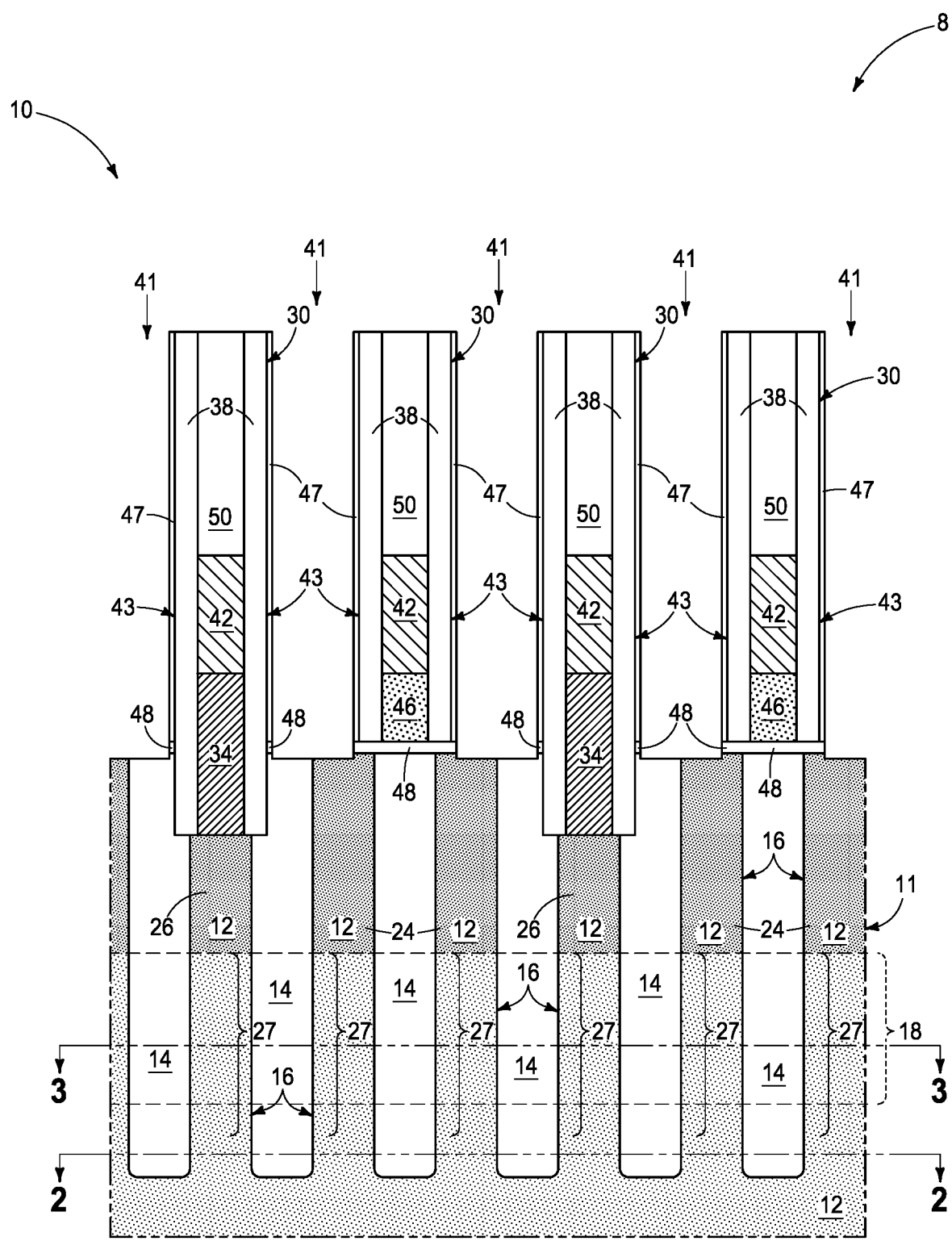
FIG. 21 is a view of the FIG. 17 construction at a processing step subsequent to that shown by FIG. 17.
Figure 22:
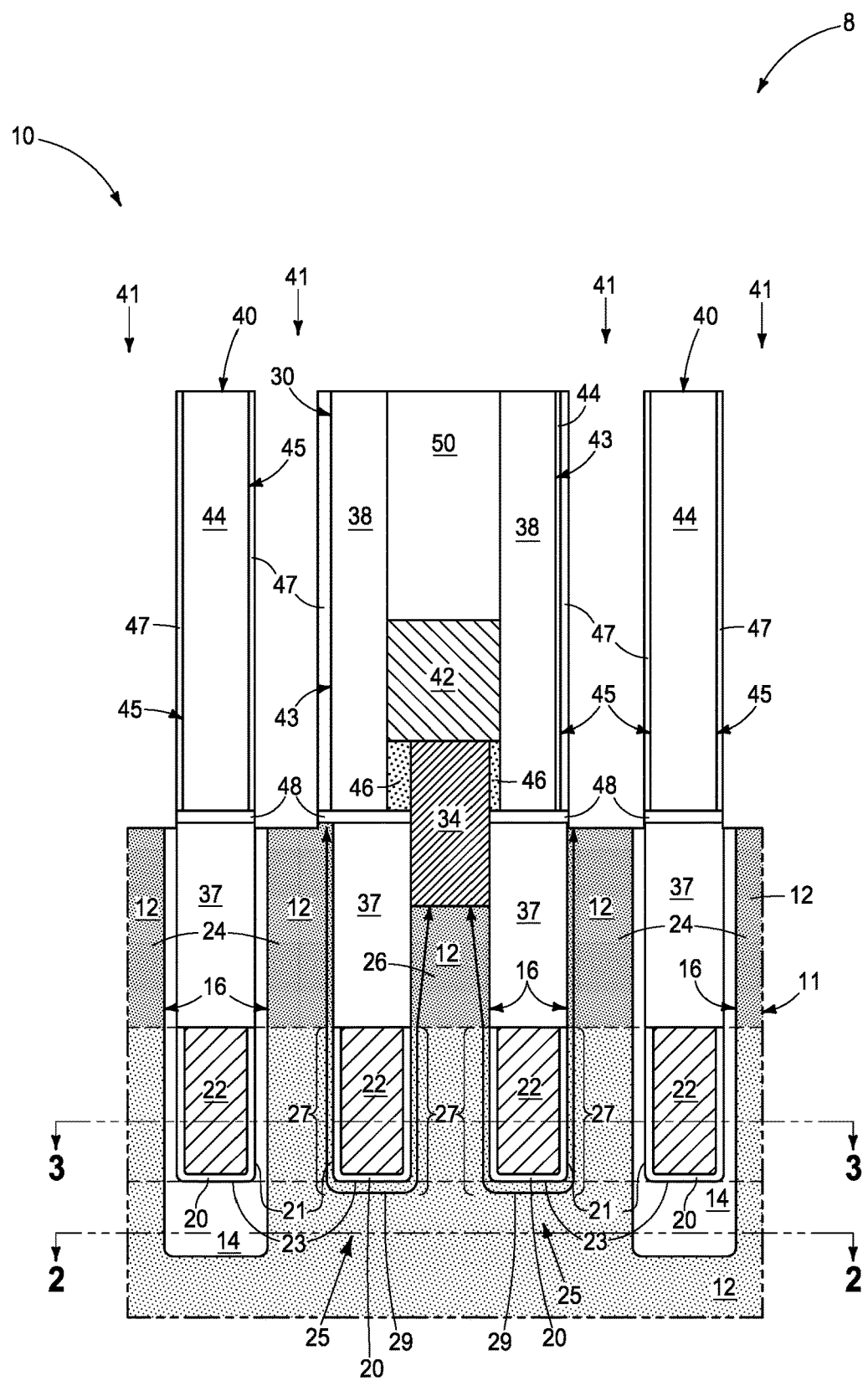
FIG. 22 is a view of the FIG. 19 construction at a processing step subsequent to that shown by FIG. 19 and at the same processing step shown by FIG. 21.

Referring to FIGS. 21 and 22, and in one embodiment, lining 47 has been subjected to a maskless anisotropic etch to remove such from being over bases of contact openings 41 and from atop structures 30, and such etching continued with the same or different chemistry to remove lower insulative material 48 at bases of contact openings 41 to expose non-shared source/drain regions 24. Such etching may etch into trench isolation material 14 and non-shared source/drain regions 24 as shown.

Figure 23:
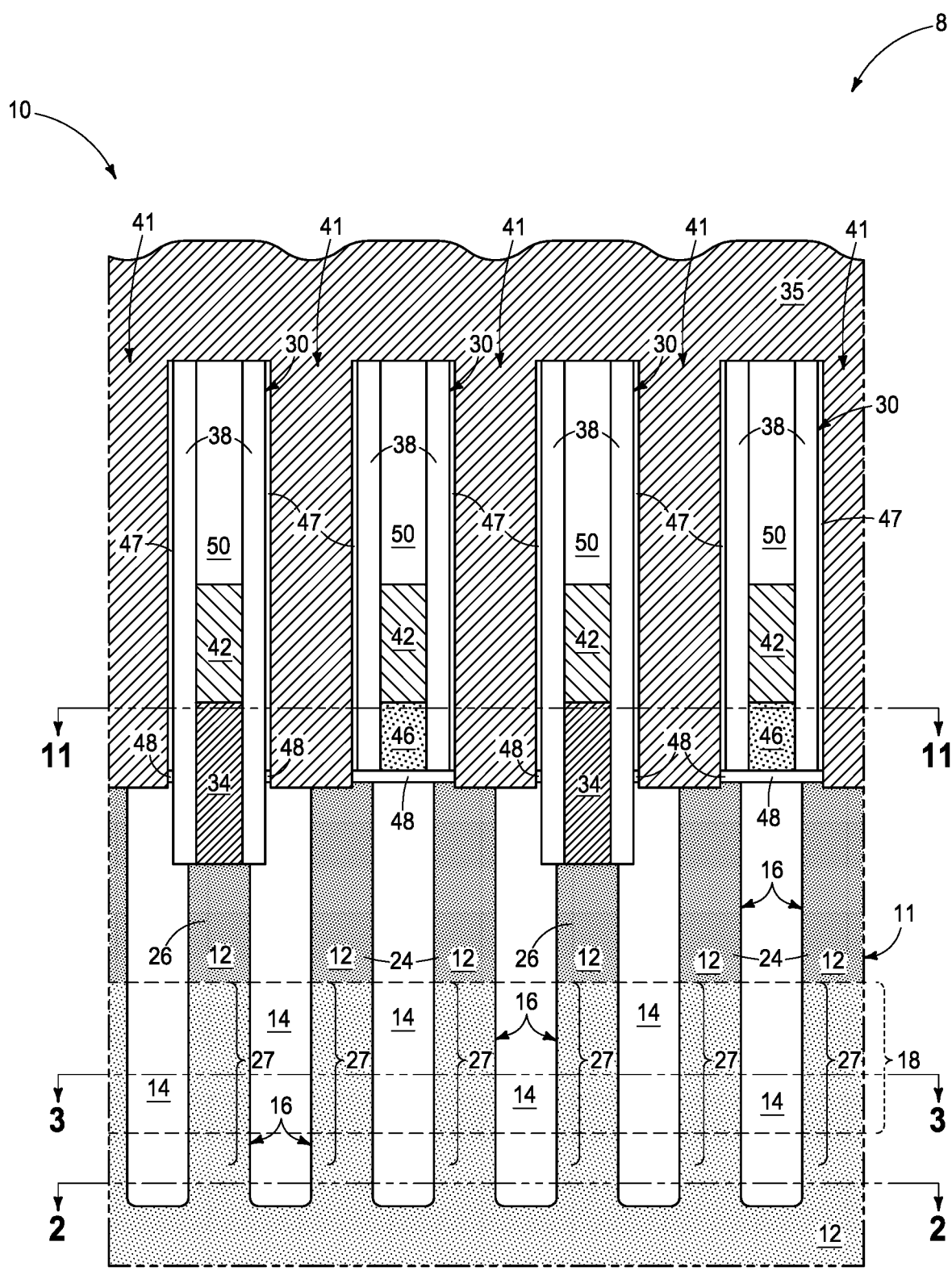
FIG. 23 is a view of the FIG. 21 construction at a processing step subsequent to that shown by FIG. 21.
Figure 24:
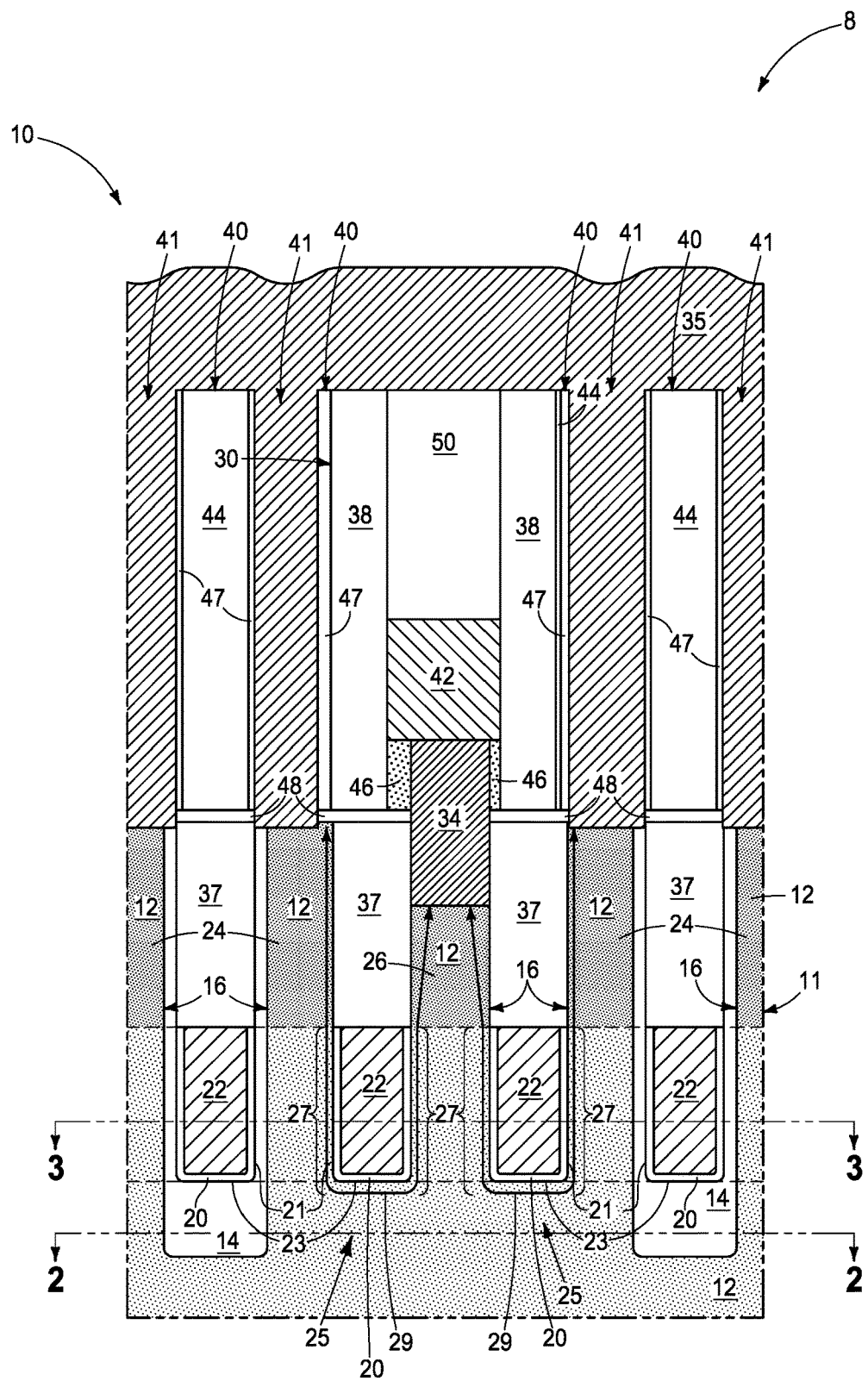
FIG. 24 is a view of the FIG. 22 construction at a processing step subsequent to that shown by FIG. 22 and at the same processing step shown by FIG. 23.
Figure 25:
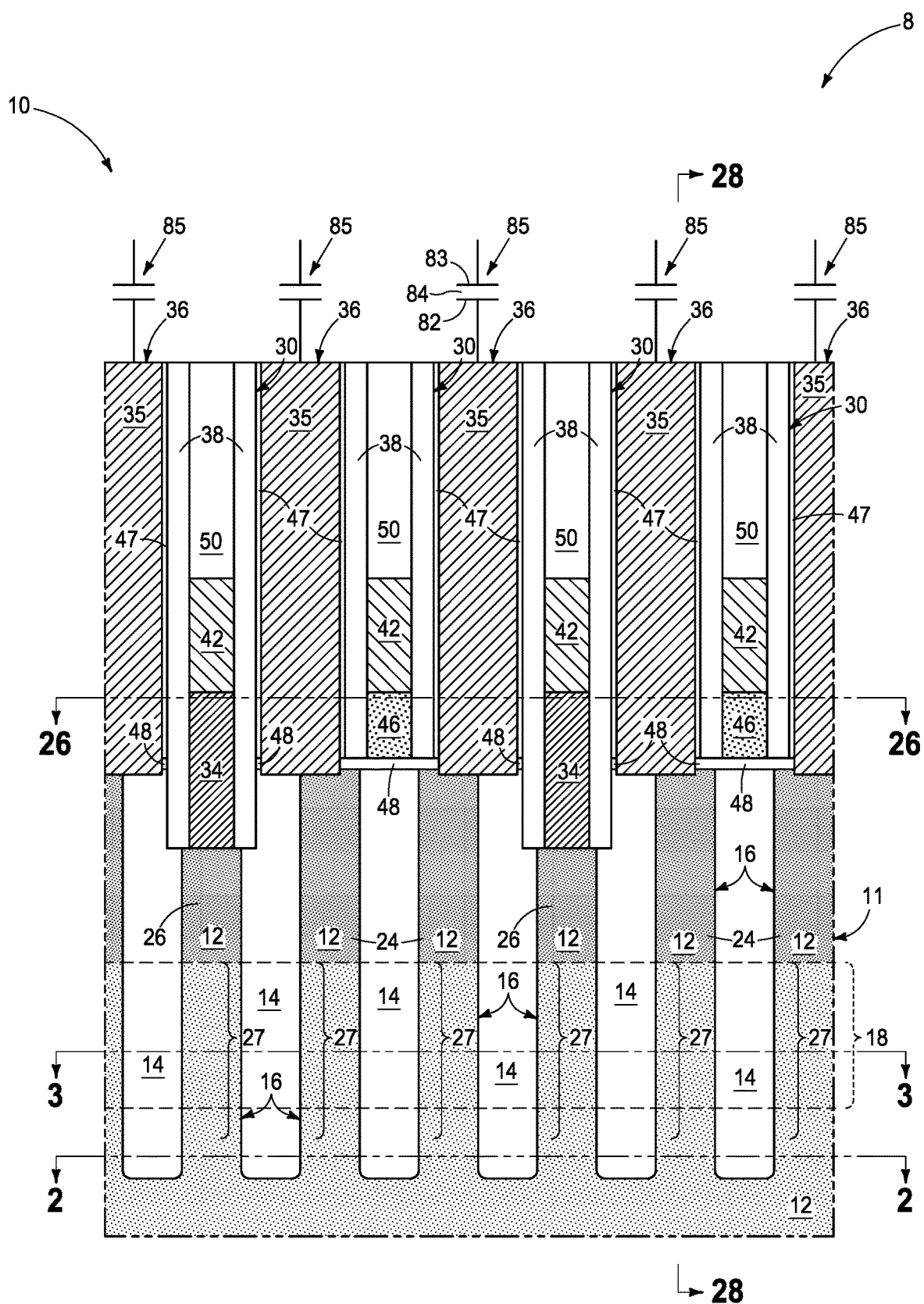
FIG. 25 is a view of the FIG. 23 construction at a processing step subsequent to that shown by FIG. 23 and is taken through line 25-25 in FIG. 26.
Figure 26:
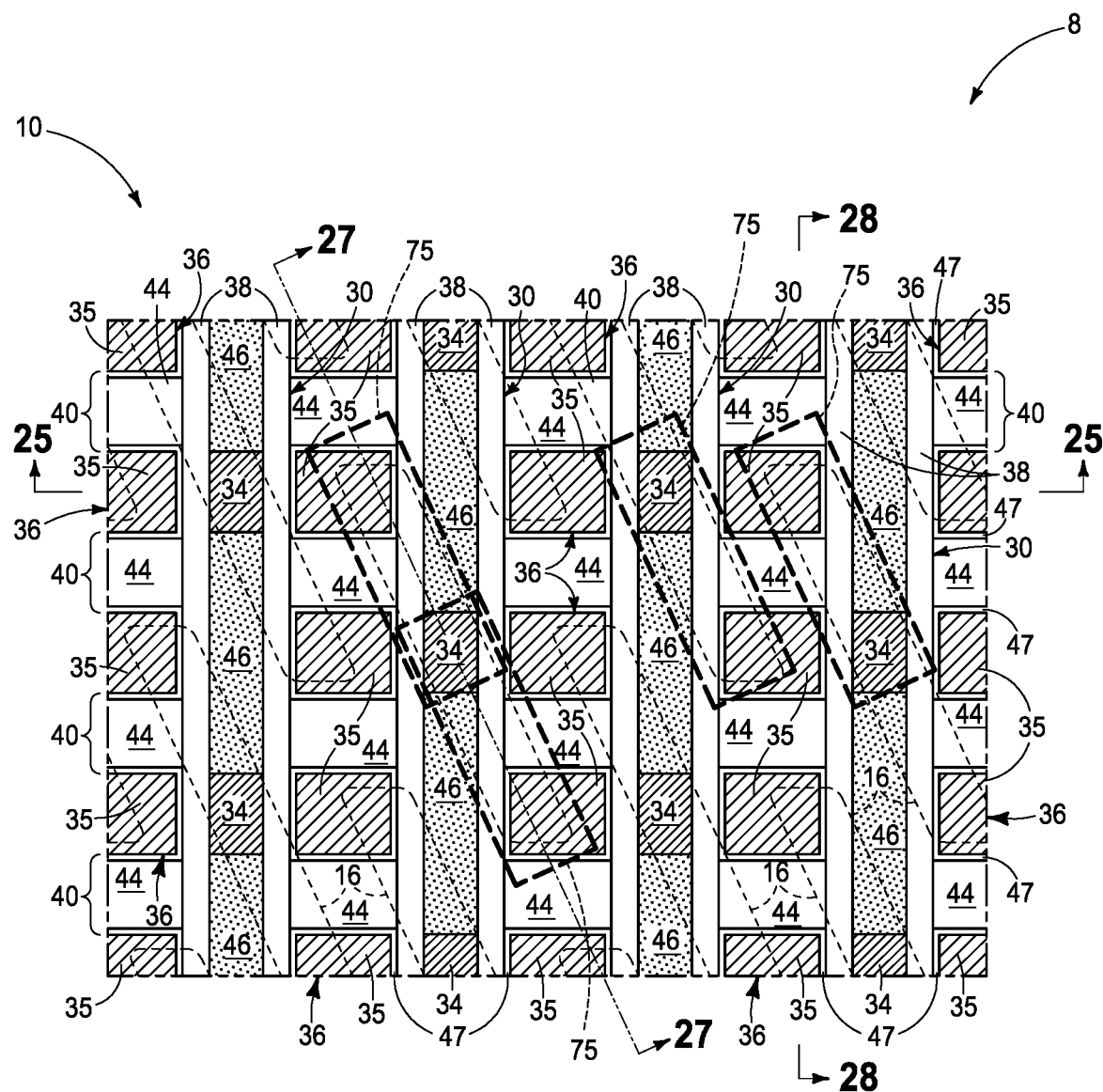
FIG. 26 is a view taken through line 26-26 in FIG. 25.
Figure 27:
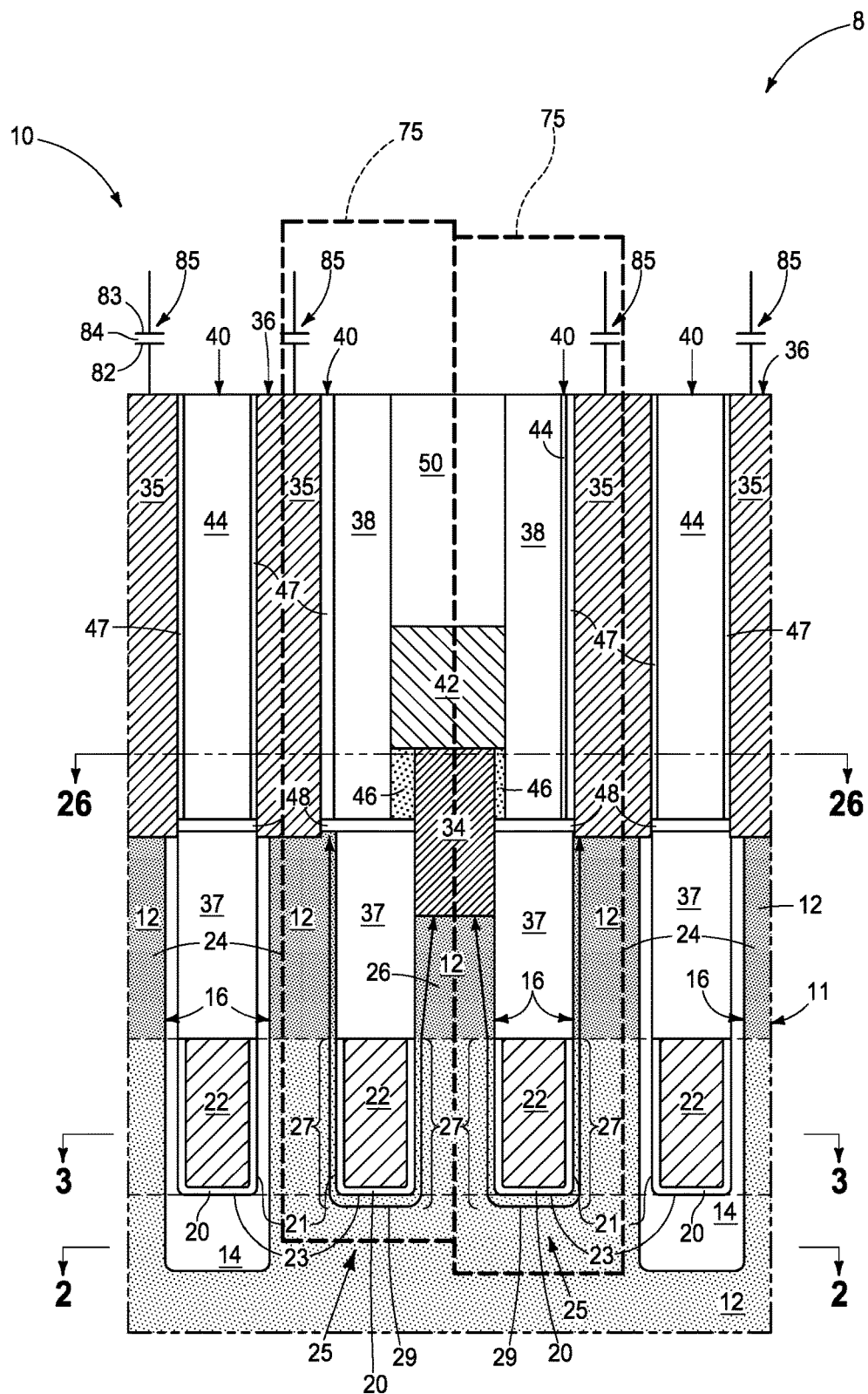
FIG. 27 is a view taken through line 27-27 in FIG. 26.
Figure 28:
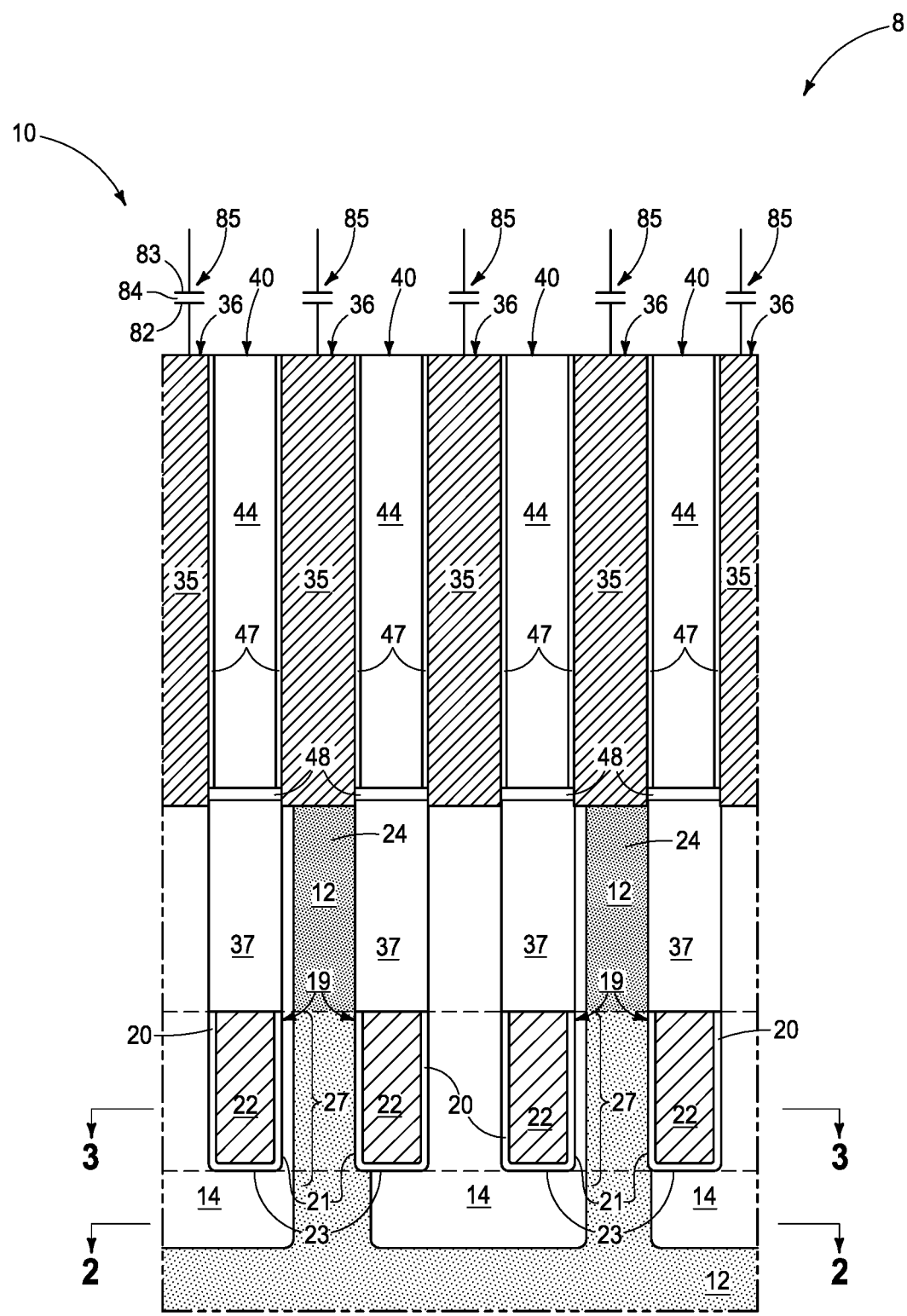
FIG. 28 is a view taken through line 28-28 in FIG. 26.

Referring to FIGS. 23 and 24, conductive material 35 (e.g., conductively-doped semiconductive material and/or metal material) has been formed in individual contact openings 41 over lining 47.

Referring to FIGS. 25-28, and in one embodiment, conductive material 35 has been polished back at least to elevationally outermost surfaces of digitline structures 30 and insulative walls 40 thereby forming conductive vias 36 laterally between and spaced longitudinally along digitline structures 30 and which are individually directly electrically coupled to one of other source/drain regions 24 in individual pairs of transistors 25. Alternately, but perhaps less preferred, conductive material 35 of FIGS. 23 and 24 might comprise multiple conductive materials, with material 35 above tops of walls 40 and digitline structures 30 being photolithographically or otherwise patterned, for example to comprise part of a redistribution layer (not shown). A plurality of capacitors 85 (shown schematically) have been formed atop the depicted structure, and individually comprise a lower conductive electrode 82, an upper conductive electrode 83, and a capacitor insulator 84 there-between. Individual lower conductive electrodes 82 are directly electrically coupled to (e.g., form a part of) individual conductive vias 36, thus forming individual DRAM memory cells 75. Accordingly, and in one embodiment, individual conductive vias 36 are formed to directly electrically couple individual source/drain regions 24 and individual capacitors 85 together in individual DRAM cells 75. In one embodiment and as shown, individual DRAM cells 75 are capacitor-over-bitline (COB), although in another embodiment the bitlines may be formed over the capacitors (not shown).

Any other attribute(s) or aspect(s) as shown and/or described herein with respect to other embodiments may be used.

Embodiments of the invention encompass a method of forming a plurality of conductive vias regardless of whether part of DRAM or other memory circuitry. Such a method comprises forming spaced contact openings (e.g., 41) individually having two opposing sidewalls (e.g., 45) comprising $Si_wB_xO_yN_z$ (e.g., 44), where "w" is from 0.1 to 0.3, "x" is from 0.1 to 0.4, "y" is from 0 to 0.2, and "z" is from 0.4 to 0.6. A lining (e.g., 47) is formed over the two opposing sidewalls in individual of the contact openings and comprises silicon nitride. A conductive via (e.g., 36) is formed in the individual contact openings over the lining. Any other attribute(s) or aspect(s) as shown and/or described herein with respect to other embodiments may be used. $Si_wB_xO_yN$, has lower permittivity than silicon nitride and silicon dioxide and accordingly may reduce parasitic capacitance, for example by 5%, 10%, 20%, or more depending on the structure.

In the above example described and shown embodiments, insulative walls 40 may be considered as pillars that are spaced between and along line structures 30. Alternately, and by way of example only, insulative walls 40 may be formed as the line structures (not shown) and pillars of material other than $Si_wB_xO_yN_z$ (not shown) may be spaced between and the line structures that comprise $Si_wB_xO_yN_z$.

Figure 29:
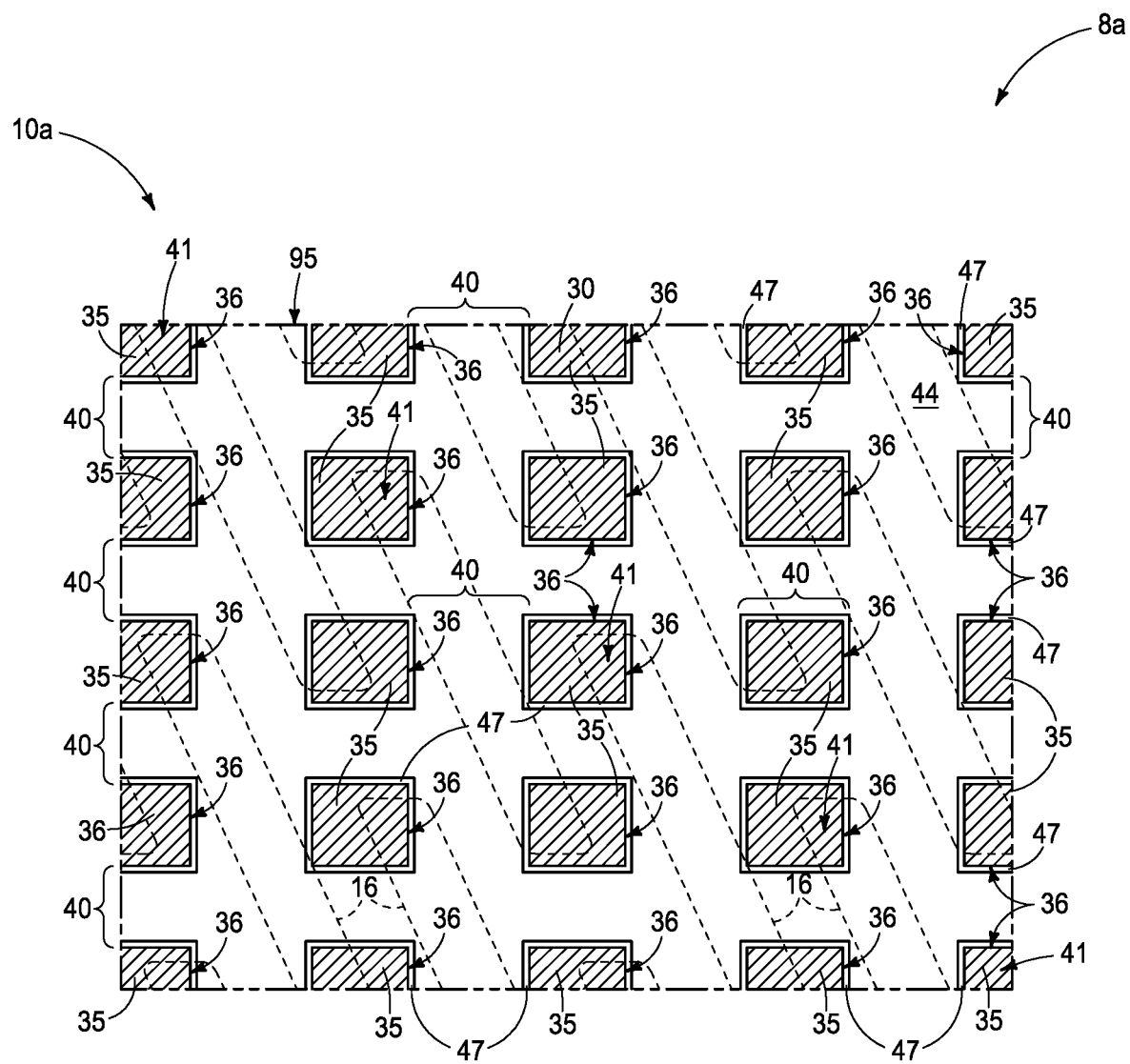
FIG. 29 is a diagrammatic cross-sectional view of a portion of construction in accordance with some embodiments of the invention.

The above described and shown embodiments show an example wherein spaced contact openings 41 and accordingly conductive vias 36 are not horizontally peripherally surrounded by any $Si_wB_xO_yN_z$ (e.g., material 38 does not comprise any $Si_wB_xO_yN_z$). By way of example only, an alternate embodiment is described with respect to FIG. 29 and a construction 8a comprising an array 10a. Like numerals from the above-described embodiments have been used where appropriate, with some construction differences being indicated with the suffix "a" or with different numerals. FIG. 29 shows an example structure corresponding to that of FIG. 26, but not necessarily comprising memory. Such shows insulative walls 40 comprising $Si_wB_xO_yN_z$ comprising material 44 formed as a lattice-like layout 95 wherein individual contact openings 41 and conductive vias 36 are horizontally peripherally surrounded by $Si_wB_xO_yN_z$ and linings 47 have been formed over all of the peripherally-surrounding $Si_wB_xO_yN_z$ before forming conductive vias 36 in individual contact openings 41 over linings 47. Pitch multiplication may be used in forming some or all of insulative walls 40 in lattice-like layout 95. Pitch multiplication may also be used in the fabrication of any other structure disclosed herein. Any other attribute(s) or aspect(s) as shown and/or described herein with respect to other embodiments may be used.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structures and/or devices embodiments.

In one embodiment, integrated circuitry (e.g., existing or future-developed circuitry, for example logic and/or memory) comprises an array (e.g., 10, 10a) of spaced conductive vias (e.g., 36). At least some immediately-adjacent of the conductive vias are separated by insulative walls (e.g., 40). The insulative walls comprise a core (e.g., 44) and a lining (e.g., 47) on opposite sides of the core. The core comprises $Si_wB_xO_yN_z$, where "w" is from 0.1 to 0.3, "x" is from 0.1 to 0.4, "y" is from 0 to 0.2, and "z" is from 0.4 to 0.6. The lining comprises silicon nitride. In one such embodiment, the at least some immediately-adjacent of the conductive vias are horizontally peripherally surrounded by such insulative walls (e.g., FIG. 29) and in another embodiment are not another embodiment are not horizontally peripherally surrounded by such insulative walls (e.g., FIG. 26). Any other attribute(s) or aspect(s) as shown and/or described herein with respect to other embodiments may be used.

In one embodiment, DRAM circuitry comprises a substrate (e.g., construction 10) comprising pairs of transistors (e.g., 25) individually comprising a pair of source/drain regions (e.g., 24, 26). A channel region (e.g., 27) is between the pair of source/drain regions. A conductive gate (e.g., 22) is operatively proximate the channel region. A gate insulator (e.g., 20) is between the conductive gate and the channel region. One of the source/drain regions (e.g., 26) of the pair of source/drain regions in individual of the pairs of transistors is laterally between the conductive gates in and is shared by the individual pairs of transistors. The others of the source/drain regions (e.g., 24) of the pair of source/drain regions are not shared in the individual pairs of transistors.

Conductive vias (e.g., 36) are individually directly electrically coupled to one of the other source/drain regions in individual pairs of transistors. At least some immediately-adjacent of the conductive vias are separated by insulative walls (e.g., 40). The insulative walls comprise a core (e.g., 44) and a lining (e.g., 47) on opposite sides of the core. The core comprises $Si_wB_xO_yN_z$, where "w" is from 0.1 to 0.3, "x" is from 0.1 to 0.4, "y" is from 0 to 0.2, and "z" is from 0.4 to 0.6. The lining comprises silicon nitride. A plurality of capacitors (e.g., 85) individually comprise a lower conductive electrode (e.g., 82), an upper conductive electrode (e.g., 83), and a capacitor insulator (e.g., 84) there-between. Individual of the lower conductive electrodes are directly electrically coupled to individual of the conductive vias. Digitline structures (e.g., 30) are individually directly electrically coupled to the one shared source/drain regions of multiple of the individual pairs of transistors (e.g., regardless of where those digitlines are positioned elevationally relative to the capacitors).

In one embodiment, the pairs of transistors comprise pairs of recessed access devices individually comprising the conductive gate being in a trench (e.g., 19) in semiconductive material (e.g., 12). The gate insulator is along sidewalls (e.g., 21) and a base (e.g., 23) of the trench between the conductive gate and the semiconductive material. The pair of source/drain regions are in upper portions of the semiconductive material on opposing sides of the trench. The channel region is in the semiconductive material below the pair of source/drain regions along the trench sidewalls and around the trench base.

Any other attribute(s) or aspect(s) as shown and/or described herein with respect to other embodiments may be used.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy or two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming a plurality of conductive vias comprises forming spaced contact openings individually having two opposing sidewalls comprising $Si_wB_xO_yN_z$, where "w" is from 0.1 to 0.3, "x" is from 0.1 to 0.4, "y" is from 0 to 0.2, and "z" is from 0.4 to 0.6. A lining comprising silicon nitride is formed over the two opposing sidewalls in individual of the contact openings. A conductive via is formed in the individual contact openings over the lining.

In some embodiments, a method of forming DRAM circuitry comprises forming a substrate to comprise pairs of transistors that individually comprise a pair of source/drain regions, a channel region between the pair of source/drain regions, a conductive gate operatively proximate the channel region, and a gate insulator between the conductive gate and the channel region. One of the source/drain regions of the pair of source/drain regions in individual of the pairs of transistors is laterally between the conductive gates in and is shared by the individual pairs of transistors. The others of the source/drain regions of the pair of source/drain regions is not shared in the individual pairs of transistors. Digitline structures are formed that are individually directly electrically coupled to the one shared source/drain region of multiple of the individual pairs of transistors. Conductive vias are formed laterally between and spaced longitudinally along the digitline structures. Individual of the conductive vias are directly electrically coupled to one of the other source/drain regions in the individual pairs of transistors. The forming of the conductive vias comprise forming spaced contact openings individually having a first two opposing sidewalls comprising $Si_wB_xO_yN_z$, where "w" is from 0.1 to 0.3, "x" is from 0.1 to 0.4, "y" is from 0 to 0.2, and "z" is from 0.4 to 0.6, and individually have a second two opposing sidewalls comprising an insulator material of different composition from $Si_wB_xO_yN_z$. A lining comprising silicon nitride is formed over the first two opposing sidewalls and over the second two opposing sidewalls in individual of the contact openings. Conductive material is formed in the individual contact openings over the lining. A plurality of capacitors is formed that individually comprise a lower conductive electrode, an upper conductive electrode, and a capacitor insulator there-between. Individual of the lower conductive electrodes are directly electrically coupled to individual of the conductive vias.

In some embodiments, integrated circuitry comprises an array of spaced conductive vias. At least some immediately-adjacent of the conductive vias are separated by insulative walls. The insulative walls comprise a core and a lining on opposite sides of the core. The core comprises $Si_wB_xO_yN_z$, where "w" is from 0.1 to 0.3, "x" is from 0.1 to 0.4, "y" is from 0 to 0.2, and "z" is from 0.4 to 0.6. The lining comprises silicon nitride.

In some embodiments, DRAM circuitry comprises a substrate comprising pairs of transistors that individually comprise a pair of source/drain regions, a channel region between the pair of source/drain regions, a conductive gate operatively proximate the channel region, and a gate insulator between the conductive gate and the channel region. One of the source/drain regions of the pair of source/drain regions in individual of the pairs of transistors is laterally between the conductive gates in and is shared by the individual pairs of transistors. The others of the source/drain regions of the pair of source/drain regions are not shared in the individual pairs of transistors. The conductive vias are individually directly electrically coupled to one of the other source/drain regions in the individual pairs of transistors. At least some immediately-adjacent of the conductive vias are separated by insulative walls. The insulative walls comprise a core and a lining on opposite sides of the core. The core comprises $Si_wB_xO_yN_z$, where "w" is from 0.1 to 0.3, "x" is from 0.1 to 0.4, "y" is from 0 to 0.2, and "z" is from 0.4 to 0.6. The lining comprises silicon nitride. A plurality of capacitors individually comprise a lower conductive electrode, an upper conductive electrode, and a capacitor insulator there-between. Individual of the lower conductive electrodes are directly electrically coupled to individual of the conductive vias. The digitline structures are individually directly electrically coupled to the one shared source/drain region of multiple of the individual pairs of transistors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a plurality of conductive vias, comprising:
   forming spaced contact openings individually having two opposing sidewalls comprising $Si_wB_xO_yN_z$, where "w" is from 0.1 to 0.3, "x" is from 0.1 to 0.4, "y" is from 0 to 0.2, and "z" is from 0.4 to 0.6;
   forming a lining comprising silicon nitride over the two opposing sidewalls in individual of the contact openings; and
   forming a conductive via in the individual contact openings over the lining.

2. The method of claim 1 wherein "y" is greater than 0.
3. The method of claim 2 wherein "y" is more than 0.05.
4. The method of claim 1 wherein the $Si_wB_xO_yN_z$ is devoid of O.
5. The method of claim 4 wherein "y" is 0.
6. The method of claim 1 wherein the lining is devoid of B.
7. The method of claim 1 wherein the lining comprises O at no greater than 25 atomic percent.
8. The method of claim 7 wherein the lining comprises O at no greater than 10 atomic percent.
9. The method of claim 8 wherein the lining comprises O at no greater than 1 atomic percent.
10. The method of claim 1 wherein the lining is devoid of O.
11. The method of claim 1 wherein the lining is devoid of B and devoid of O.
12. The method of claim 1 wherein the lining consists essentially of silicon nitride.
13. The method of claim 1 wherein the lining consists of silicon nitride.

14. The method of claim 1 comprising forming the spaced contact openings to be horizontally peripherally surrounded by $Si_wB_xO_yN_z$, and forming the lining over all of the peripherally-surrounded $Si_wB_xO_yN_z$ before forming the conductive via in the individual contact openings over the lining.
15. The method of claim 1 comprising forming the spaced contact openings to not be horizontally peripherally surrounded by $Si_wB_xO_yN_z$.
16. The method of claim 1 comprising forming individual of the conductive vias to directly electrically couple individual source/drain regions and individual capacitors together in individual DRAM cells.
17. The method of claim 16 wherein the individual DRAM cells are COB.
18. A method of forming DRAM circuitry, comprising:
   forming a substrate to comprise pairs of transistors individually comprising:
      a pair of source/drain regions;
      a channel region between the pair of source/drain regions;
      a conductive gate operatively proximate the channel region;
      a gate insulator between the conductive gate and the channel region; and
      one of the source/drain regions of the pair of source/drain regions in individual of the pairs of transistors being laterally between the conductive gates in and being shared by the individual pairs of transistors, the others of the source/drain regions of the pair of source/drain regions not being shared in the individual pairs of transistors;
   forming digitline structures that are individually directly electrically coupled to the one shared source/drain region of multiple of the individual pairs of transistors;
   forming conductive vias laterally between and spaced longitudinally along the digitline structures, individual of the conductive vias being directly electrically coupled to one of the other source/drain regions in the individual pairs of transistors, the forming of the conductive vias comprising:
      forming spaced contact openings individually having a first two opposing sidewalls comprising $Si_wB_xO_yN_z$, where "w" is from 0.1 to 0.3, "x" is from 0.1 to 0.4, "y" is from 0 to 0.2, and "z" is from 0.4 to 0.6, and individually having a second two opposing sidewalls comprising an insulator material of different composition from $Si_wB_xO_yN_z$;
      forming a lining comprising silicon nitride over the first two opposing sidewalls and over the second two opposing sidewalls in individual of the contact openings; and
      forming conductive material in the individual contact openings over the lining; and
   forming a plurality of capacitors individually comprising a lower conductive electrode, an upper conductive electrode, and a capacitor insulator there-between; individual of the lower conductive electrodes being directly electrically coupled to individual of the conductive vias.
19. The method of claim 18 wherein the pairs of transistors comprise pairs of recessed access devices individually comprising:
   the conductive gate being in a trench in semiconductive material;

the gate insulator being along sidewalls and a base of the trench between the conductive gate and the semiconductive material;

the pair of source/drain regions being in upper portions of the semiconductive material on opposing sides of the trench; and the channel region being in the semiconductive material below the pair of source/drain regions along the trench sidewalls and around the trench base.

20. Integrated circuitry comprising:

an array of spaced conductive vias;

at least some immediately-adjacent of the conductive vias being separated by insulative walls, the insulative walls comprising a core and a lining on opposite sides of the core;

the core comprising $Si_wB_xO_yN_z$, where "w" is from 0.1 to 0.3, "x" is from 0.1 to 0.4, "y" is from 0 to 0.2, and "z" is from 0.4 to 0.6; and the lining comprising silicon nitride.

21. The integrated circuitry of claim 20 wherein said at least some immediately-adjacent of the conductive vias are horizontally peripherally surrounded by said insulative walls.

22. The integrated circuitry of claim 20 wherein said at least some immediately-adjacent of the conductive vias are not horizontally peripherally surrounded by said insulative walls.

23. The integrated circuitry of claim 20 comprising DRAM, individual of the conductive vias directly electrically coupling individual source/drain regions and individual capacitors together in individual DRAM cells.

24. The integrated circuitry of claim 23 wherein the individual DRAM cells are COB.

25. The integrated circuitry of claim 24 comprising insulator material directly against two opposing sidewalls of said at least some immediately-adjacent of the conductive vias, said insulator material being part of two immediately-adjacent bit line constructions.

26. DRAM circuitry, comprising:

a substrate comprising pairs of transistors individually comprising:

a pair of source/drain regions;

a channel region between the pair of source/drain regions;

a conductive gate operatively proximate the channel region;

a gate insulator between the conductive gate and the channel region; and one of the source/drain regions of the pair of source/drain regions in individual of the pairs of transistors being laterally between the conductive gates in and being shared by the individual pairs of transistors, the others of the source/drain regions of the pair of source/drain regions not being shared in the individual pairs of transistors;

conductive vias that are individually directly electrically coupled to one of the other source/drain regions in the individual pairs of transistors;

at least some immediately-adjacent of the conductive vias being separated by insulative walls, the insulative walls comprising a core and a lining on opposite sides of the core; the core comprising $Si_wB_xO_yN_z$, where "w" is from 0.1 to 0.3, "x" is from 0.1 to 0.4, "y" is from 0 to 0.2, and "z" is from 0.4 to 0.6; the lining comprising silicon nitride;

a plurality of capacitors individually comprising a lower conductive electrode, an upper conductive electrode, and a capacitor insulator there-between; individual of the lower conductive electrodes being directly electrically coupled to individual of the conductive vias; and digitline structures that are individually directly electrically coupled to the one shared source/drain region of multiple of the individual pairs of transistors.

27. The DRAM circuitry of claim 26 wherein the pairs of transistors comprise pairs of recessed access devices individually comprising:

the conductive gate being in a trench in semiconductive material;

the gate insulator being along sidewalls and a base of the trench between the conductive gate and the semiconductive material;

the pair of source/drain regions being in upper portions of the semiconductive material on opposing sides of the trench; and the channel region being in the semiconductive material below the pair of source/drain regions along the trench sidewalls and around the trench base.

* * * * *